United States Patent
Ku et al.

(10) Patent No.: US 12,010,840 B2
(45) Date of Patent: Jun. 11, 2024

(54) VERTICAL TYPE NON-VOLATILE MEMORY DEVICE AND METHOD OF MANUFACTURING THE SAME

(71) Applicant: SAMSUNG ELECTRONICS CO., LTD., Suwon-si (KR)

(72) Inventors: Leeeun Ku, Seoul (KR); Yuna Lee, Seoul (KR); Sunyoung Kim, Seongnam-si (KR); Kyungjae Park, Hwaseong-si (KR); Jonghyun Park, Hwaseong-si (KR); Bora Lee, Hwaseong-si (KR); Jongho Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 123 days.

(21) Appl. No.: 17/013,726

(22) Filed: Sep. 7, 2020

(65) Prior Publication Data

US 2021/0202519 A1 Jul. 1, 2021

(30) Foreign Application Priority Data

Dec. 26, 2019 (KR) ........................ 10-2019-0175495

(51) Int. Cl.
*H01L 27/115* (2017.01)
*H01L 23/522* (2006.01)
(Continued)

(52) U.S. Cl.
CPC ......... *H10B 43/27* (2023.02); *H01L 23/5226* (2013.01); *H10B 43/10* (2023.02)

(58) Field of Classification Search
CPC ........... H01L 27/11524; H01L 27/1157; H01L 27/11578; H01L 27/11582; H01L 29/7808;
(Continued)

(56) References Cited

U.S. PATENT DOCUMENTS 7,696,559 B2 * 4/2010 Arai .................. H01L 29/66833
257/315
7,982,260 B2 * 7/2011 Fukuzumi ............. H01L 29/792
257/329
(Continued)

FOREIGN PATENT DOCUMENTS

CN 111968987 A * 11/2020

OTHER PUBLICATIONS

German Application Office Action Dated May 9, 2022 Cited in De Patent Application No. 102020118989.3.

*Primary Examiner* — Mary A Wilczewski
*Assistant Examiner* — Tsz K Chiu
(74) *Attorney, Agent, or Firm* — Fish & Richardson P.C.

(57) ABSTRACT

A vertical type non-volatile memory device includes a substrate having a cell array area of a block unit and an extension area, a vertical contact disposed in the extension area, a plurality of vertical channel structures provided on the substrate in the cell array area, a plurality of dummy channel structures provided on the substrate in the extension area, and a plurality of gate electrode layers and a plurality of interlayer insulation layers stacked alternately on the substrate. In an electrode pad connected to the vertical contact, dummy channel structures are disposed at both sides of the vertical contact and a horizontal cross-sectional surface of each of the plurality of dummy channel structures has a shape which is longer in one direction.

19 Claims, 24 Drawing Sheets

(51) Int. Cl.
 *H10B 43/10* (2023.01)
 *H10B 43/27* (2023.01)
(58) Field of Classification Search
 CPC ........... H01L 27/11273; H01L 29/7802; H01L 29/66712; H01L 27/11517; H01L 29/788; H01L 29/42324; H01L 29/66825; H01L 29/792; H01L 2924/13081; H01L 2924/13085; H01L 29/6684; H01L 29/78391; H01L 23/5226; H01L 23/5283; H01L 21/76816; H01L 21/76865; H01L 21/76877; H01L 21/76831; H01L 29/4236; H10B 43/27; H10B 41/35; H10B 41/41; H10B 41/27; H10B 43/35; H10B 43/40; H10B 43/10; H10B 43/50; H10B 20/40; H10B 41/00
 See application file for complete search history.

(56) References Cited

U.S. PATENT DOCUMENTS

| | | | | |
|---|---|---|---|---|
| 8,030,700 B2* | 10/2011 | Sakamoto | ......... | H01L 27/11578 257/306 |
| 8,072,024 B2* | 12/2011 | Ishikawa | ........... | H01L 27/11582 438/386 |
| 8,211,811 B2* | 7/2012 | Matsushita | ....... | H01L 29/66833 438/763 |
| 8,236,673 B2* | 8/2012 | Son | ..................... | H01L 29/7926 438/259 |
| 8,338,876 B2* | 12/2012 | Kito | .................... | H01L 29/7926 257/314 |
| 8,349,681 B2* | 1/2013 | Alsmeier | .......... | H01L 29/66825 257/E21.309 |
| 8,415,242 B2* | 4/2013 | Mizushima | ......... | H01L 29/7926 257/E21.409 |
| 8,552,489 B2* | 10/2013 | Eom | .................... | H01L 29/4234 257/E21.21 |
| 8,658,499 B2* | 2/2014 | Makala | ............. | H01L 29/40117 257/334 |
| 8,829,595 B2* | 9/2014 | Lee | .................... | H01L 27/11582 257/E21.21 |
| 8,928,061 B2* | 1/2015 | Chien | ............... | H01L 21/32053 257/315 |
| 8,994,091 B2* | 3/2015 | Lee | ..................... | H01L 29/7926 257/316 |
| 9,018,682 B2* | 4/2015 | Izumida | ............ | H01L 27/11582 257/234 |
| 9,076,879 B2* | 7/2015 | Yoo | ..................... | H01L 29/7926 |
| 9,099,496 B2* | 8/2015 | Tian | ................... | H01L 29/7889 |
| 9,159,739 B2* | 10/2015 | Makala | ............. | H01L 27/11556 |
| 9,236,396 B1* | 1/2016 | Koka | .................... | H01L 29/517 |
| 9,305,849 B1* | 4/2016 | Tsutsumi | ............ | H01L 27/1157 |
| 9,312,008 B2* | 4/2016 | Nam | ................... | G11C 16/3459 |
| 9,406,694 B1* | 8/2016 | Ikeno | ................ | H01L 29/66833 |
| 9,564,451 B1 | 2/2017 | Shin et al. | | |
| 9,634,024 B2* | 4/2017 | Kanamori | ........... | H01L 27/1157 |
| 9,659,958 B2* | 5/2017 | Lee | .................... | H01L 27/11582 |
| 9,960,181 B1* | 5/2018 | Cui | ....................... | H10B 41/50 |
| 10,068,917 B2* | 9/2018 | Kanamori | ......... | H01L 27/11582 |
| 10,276,583 B2* | 4/2019 | Sharangpani | ....... | H01L 27/0688 |
| 10,340,286 B2* | 7/2019 | Goda | ................ | H01L 27/11582 |
| 10,566,346 B2* | 2/2020 | Lee | ................... | H01L 27/11568 |
| 2008/0173928 A1* | 7/2008 | Arai | ................... | H01L 29/7926 257/E21.409 |
| 2010/0019310 A1* | 1/2010 | Sakamoto | ............. | H01L 29/792 257/324 |
| 2010/0038699 A1* | 2/2010 | Katsumata | ........ | H01L 29/66833 257/E21.409 |
| 2012/0012920 A1* | 1/2012 | Shin | ................... | H01L 29/4234 257/E29.262 |
| 2012/0091521 A1* | 4/2012 | Goda | ................ | H01L 29/66666 257/E29.17 |
| 2012/0098050 A1* | 4/2012 | Shim | ................. | H01L 27/11578 257/E29.262 |
| 2012/0140562 A1* | 6/2012 | Choe | .................. | H01L 27/1157 257/329 |
| 2012/0267702 A1* | 10/2012 | Jee | .................... | H01L 27/11582 257/E21.423 |
| 2013/0134493 A1* | 5/2013 | Eom | .................... | H01L 27/11582 257/314 |
| 2013/0270643 A1* | 10/2013 | Lee | .................... | H01L 27/1052 257/365 |
| 2014/0203442 A1* | 7/2014 | Yun | ................... | H01L 27/11548 257/773 |
| 2015/0372101 A1 | 12/2015 | Lee et al. | | |
| 2016/0293625 A1* | 10/2016 | Kang | ................ | H01L 27/11565 |
| 2017/0040337 A1* | 2/2017 | Kim | .................. | H01L 27/11573 |
| 2017/0221921 A1* | 8/2017 | Kanamori | ......... | H01L 29/42344 |
| 2017/0309635 A1* | 10/2017 | Kim | .................... | H01L 27/0688 |
| 2018/0102314 A1 | 4/2018 | Kim et al. | | |
| 2018/0122819 A1 | 5/2018 | Shim et al. | | |
| 2018/0301374 A1* | 10/2018 | Masamori | ............. | H10B 43/40 |
| 2018/0337192 A1 | 11/2018 | Kim et al. | | |
| 2019/0035806 A1 | 1/2019 | Jung et al. | | |
| 2019/0035942 A1 | 1/2019 | Kwon et al. | | |
| 2019/0067321 A1 | 2/2019 | Song et al. | | |
| 2019/0157283 A1 | 5/2019 | Jung et al. | | |
| 2019/0326318 A1 | 10/2019 | Jung et al. | | |
| 2019/0341396 A1 | 11/2019 | You et al. | | |
| 2020/0119031 A1* | 4/2020 | Shen | ................ | H01L 27/11524 |
| 2021/0050368 A1* | 2/2021 | Han | ....................... | H10B 43/27 |

* cited by examiner

VERTICAL TYPE NON-VOLATILE MEMORY DEVICE AND METHOD OF MANUFACTURING THE SAME

CROSS-REFERENCE TO RELATED APPLICATION

A claim of priority under 35 U.S.C. § 119 is made to Korean Patent Application No. 10-2019-0175495, filed on Dec. 26, 2019, in the Korean Intellectual Property Office, the entire content of which is hereby incorporated by reference.

BACKGROUND

The inventive concepts relate to non-volatile memory devices and methods of manufacturing the same, and more particularly to non-volatile memory devices having vertical channel structure that increases the degree of integration and methods of manufacturing the same.

Recently, there has been significant increase in the use of non-volatile memory devices in electronic devices. For example, MP3 players, digital cameras, portable phones, camcorders, flash cards, and solid state disks (SSDs) typically include non-volatile memory as storage devices. Among the different types of non-volatile memory, flash memory has a function of electrically erasing data one cell at a time, and is now more widely used as storage devices than hard drives. Recently, in view of the demand for increased storage capacity, a method of more efficiently using the storage space of flash memory is desired. Accordingly, instead of utilizing planar transistor structures, non-volatile memory devices having vertical transistor structures have been developed.

SUMMARY

Embodiments of the inventive concepts provide a vertical type non-volatile memory device having enhanced reliability and degree of integration, and a method of manufacturing the same.

Embodiments of the inventive concepts provide a vertical type non-volatile memory device including a substrate having a cell array area and an extension area extending in a first direction from the cell array area, the first direction extending parallel to a top surface of the substrate; a vertical contact disposed on the substrate in the extension area and extending in a vertical direction perpendicular to the top surface of the substrate; a plurality of vertical channel structures on the substrate in the cell array area and extending in the vertical direction; a plurality of dummy channel structures on the substrate in the extension area and extending in the vertical direction and disposed adjacent to the vertical contact; a plurality of gate electrode layers and a plurality of interlayer insulation layers stacked alternately on the substrate in the cell array area and the extension area along sidewalls of the plurality of vertical channel structures and the plurality of dummy channel structures; and an electrode pad connected to the vertical contact. In the electrode pad, first and second dummy channel structures from among the plurality of dummy channel structures are respectively disposed at first and second sides of the vertical contact in the first direction, and a horizontal cross-sectional surface of each of the plurality of dummy channel structures has a shape that is longer in a second direction than in the first direction, the second direction extending parallel to the top surface of the substrate and perpendicular to the first direction.

Embodiments of the inventive concepts further provide a vertical type non-volatile memory device including a substrate having a cell array area and an extension area extending in a first direction from the cell array area, the first direction extending parallel to a top surface of the substrate; a vertical contact disposed on the substrate in the extension area and extending in a vertical direction perpendicular to the top surface of the substrate; a plurality of vertical channel structures on the substrate in the cell array area and extending in the vertical direction; a plurality of dummy channel structures on the substrate in the extension area and extending in the vertical direction and disposed adjacent to the vertical contact; a plurality of gate electrode layers and a plurality of interlayer insulation layers stacked alternately on the substrate in the cell array area and the extension area along sidewalls of the plurality of vertical channel structures and the plurality of dummy channel structures; and an electrode pad connected to the vertical contact. In the electrode pad the plurality of dummy channel structures are respectively disposed at vertex positions of a tetragonal shape with respect to the vertical contact and the vertical contact is between the plurality of dummy channel structures, and a horizontal cross-sectional surface of each of the plurality of dummy channel structures has a trapezoid shape having a vertex portion that is curved.

Embodiments of the inventive concepts still further provide a vertical type non-volatile memory device including a substrate having a cell array area and an extension area extending a first direction from the cell array area, the first direction extending parallel to a top surface of the substrate; a plurality of vertical channel structures on the substrate in the cell array area and extending in a vertical direction perpendicular to the top surface of the substrate; a plurality of vertical contacts disposed in the extension area and connected to respective ones of a plurality of electrode pads; a plurality of dummy channel structures on the substrate in the extension area and extending in the vertical direction and respectively disposed adjacent to the plurality of vertical contacts; a plurality of gate electrode layers and a plurality of interlayer insulation layers stacked alternately on the substrate in the cell array area and the extension area along sidewalls of the plurality of vertical channel structures and the plurality of dummy channel structures; and a division area extending in the first direction and dividing the plurality of gate electrode layers in a second direction, the second direction extending parallel to the top surface of the substrate and perpendicular to the first direction. In at least one of the plurality of electrode pads dummy channel structures from among the plurality of dummy channel structures are disposed at both sides in the first direction of a corresponding vertical contact from among the plurality of vertical contacts to which the at least one of the plurality of electrode pads is connected, and portions of the dummy channel structures are placed on a line passing through the corresponding vertical contact in the first direction.

Embodiments of the inventive concepts also provide a method of manufacturing a vertical type non-volatile memory device, the method including designing a layout of a pattern of a horizontal cross-sectional surface of dummy channel structures which are to be formed in an electrode pad of the vertical type non-volatile memory device; performing optical proximity correction (OPC) based on the layout to obtain design data of a mask; manufacturing the mask based on the design data; and forming the dummy channel structure using the mask. The vertical type non-volatile memory device includes a substrate having a cell array area and an extension area extending in a first direction from the cell array area, a vertical contact disposed in the extension area, and a division area dividing a gate electrode layer in a second direction perpendicular to the first direction. The dummy channel structures are disposed in the electrode pad to surround the vertical contact, and first and second dummy channel structures from among the dummy channel structures are disposed at first and second sides of the vertical contact in the first direction, or four dummy channel structures from among the dummy channel structures are disposed at vertex positions of a tetragonal shape with respect to the vertical contact with the vertical contact between the four dummy channel structures. The designing of the layout so that a distance between the dummy channel structures and the division area is within a first setting range in the second direction, and a maximum distance between two dummy channel structures from among the dummy channel structures in a diagonal direction crossing the vertical contact is within a second setting range.

Embodiments of the inventive concepts still further provide a vertical type non-volatile memory device including a substrate having a cell array area and an extension area extending in a first direction from the cell array area, the first direction extending parallel to a top surface of the substrate; a vertical contact disposed on the substrate in the extension area and extending in a vertical direction perpendicular to the top surface of the substrate; a plurality of dummy channel structures on the substrate in the extension area and extending in the vertical direction and disposed adjacent to the vertical contact; a plurality of gate electrode layers and a plurality of interlayer insulation layers stacked alternately on the substrate in the cell array area and the extension area along sidewalls of the plurality of dummy channel structures; an electrode pad connected to the vertical contact, the electrode pad includes at least one first dummy channel structure from among the plurality of dummy channel structures disposed at a first side of the vertical contact in the first direction, and at least one second dummy channel structure from among the plurality of dummy channel structures disposed at a second side of the vertical contact in the first direction; and a division area extending in the first direction and dividing the plurality of gate electrode layers in a second direction, the second direction extending parallel to the top surface of the substrate and perpendicular to the first direction.

BRIEF DESCRIPTION OF THE DRAWINGS

Embodiments of the inventive concepts will be described in detail with reference to the accompanying drawings in which.

DETAILED DESCRIPTION OF THE EMBODIMENTS

Hereinafter, embodiments will be described in detail with reference to the accompanying drawings. Like numeral references refer to like elements, and their repetitive descriptions may be omitted.

Figure 1:
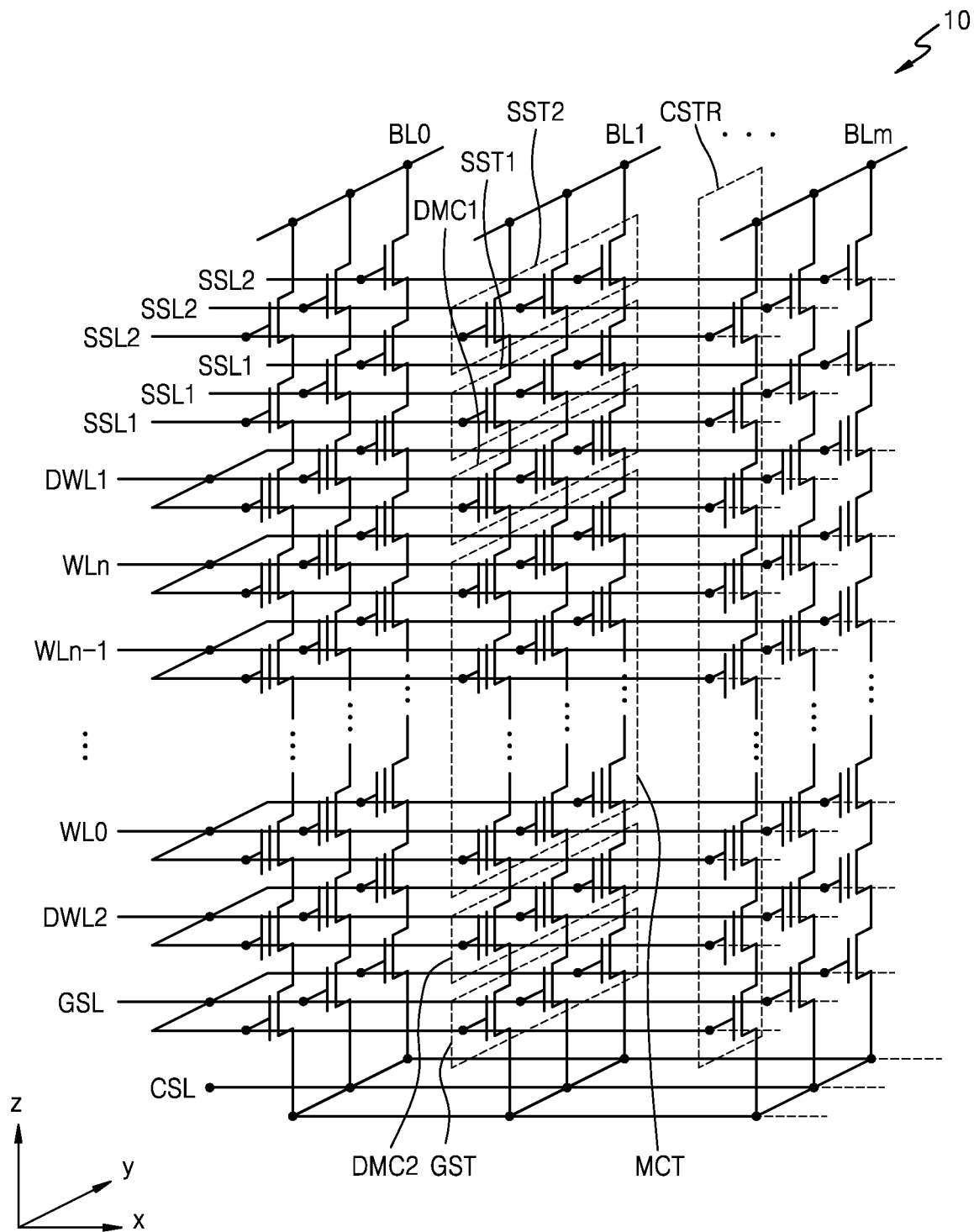
FIG. 1 illustrates an equivalent circuit diagram of a memory cell array of a vertical type non-volatile memory device according to embodiments of the inventive concepts.

FIG. 1 illustrates an equivalent circuit diagram of a memory cell array of a vertical type non-volatile memory device 10 according to embodiments of the inventive concepts.

Referring to FIG. 1, the vertical type non-volatile memory device 10 according to an embodiment may include a common source line CSL, a plurality of bit lines BL0 to BLm (e.g., BL0, BL1 to BLm), and a plurality of cell strings CSTR. The plurality of bit lines BL0 to BLm may be two-dimensionally arranged, and the plurality of cell strings CSTR may be respectively connected to the plurality of bit lines BL0 to BLm in parallel. The plurality of cell strings CSTR may be connected to the common source line CSL in common.

Each of the plurality of cell strings CSTR may include a plurality of string selection transistors (for example, first and second string selection transistors) SST1 and SST2 having gates connected to respective string selection lines SSL1 and SSL2, a plurality of cell transistors MCT, and a ground selection transistor GST having a gate connected to a ground selection line GSL. The memory cell transistors MCT may each include a data storage element. In detail, the first and second string selection transistors SST1 and SST2 may be serially connected to each other, the second string selection transistor SST2 may be connected to a corresponding bit line, and the ground selection transistor GST may be connected to the common source line CSL. Also, the memory cell transistors MCT may be connected in series between the first string selection transistor SST1 and the ground selection transistor GST. Although each of the cell strings CSTR are shown in FIG. 1 as including first and second string selection transistor SST1 and SST2, in other embodiments each of the cell strings CSTR may include one string selection transistor.

As illustrated in FIG. 1, each of the cell strings CSTR may include a first dummy cell transistor DMC1 connected between the first string selection transistor SST1 and a corresponding memory cell transistor MCT, and a second dummy cell transistor DMC2 connected between the ground selection transistor GST and a corresponding memory cell transistor MCT. The first dummy cell transistor DMC1 may have a gate connected to a dummy word line DWL1, and the second dummy cell transistor DMC2 may have a gate connected to a dummy word line DWL2. Although each of the cell strings CSTR are shown in FIG. 1 as including first and second dummy cell transistors DMC1 and DMC2, in other embodiments at least one of the first and second dummy cell transistors DMC1 and DMC2 may be omitted from the cell strings CSTR.

Each cell string CSTR may include a plurality of memory cell transistors MCT where distances to common source lines CSL differ, and thus, a plurality of multi-layer word lines WL0 to WLn (e.g., WL0, WLn−1 to WLn) may be disposed between the common source lines CSL and the bit lines BL0 to BLm. Also, gate electrodes of memory cell transistors MCT disposed at substantially the same distance to common source lines CSL may be connected to one of the word lines WL0 to WLn in common and may be in an equivalent potential state.

In the vertical type non-volatile memory device 10 according to embodiments, a dummy channel structure (see DCS of FIG. 2) may be disposed in an electrode pad (see ELp of FIG. 2) corresponding to one vertical contact VC, in an extension area where a vertical contact (see VC of FIG. 2) is disposed, and in this case, a horizontal cross-sectional surface of a dummy channel structure DCS0 may have various shapes on the basis of a characteristic of a manufacturing process. Therefore, a manufacturing process of the vertical type non-volatile memory device 10 according to the embodiments may be easy to perform, and the vertical type non-volatile memory device 10 may have enhanced reliability and degree of integration, based on a shape of a horizontal cross-sectional surface of a dummy channel structure DCS. A shape of the horizontal cross-sectional surface of the dummy channel structure DCS will be described below in detail with reference to FIGS. 2 to 9B.

Figure 2:
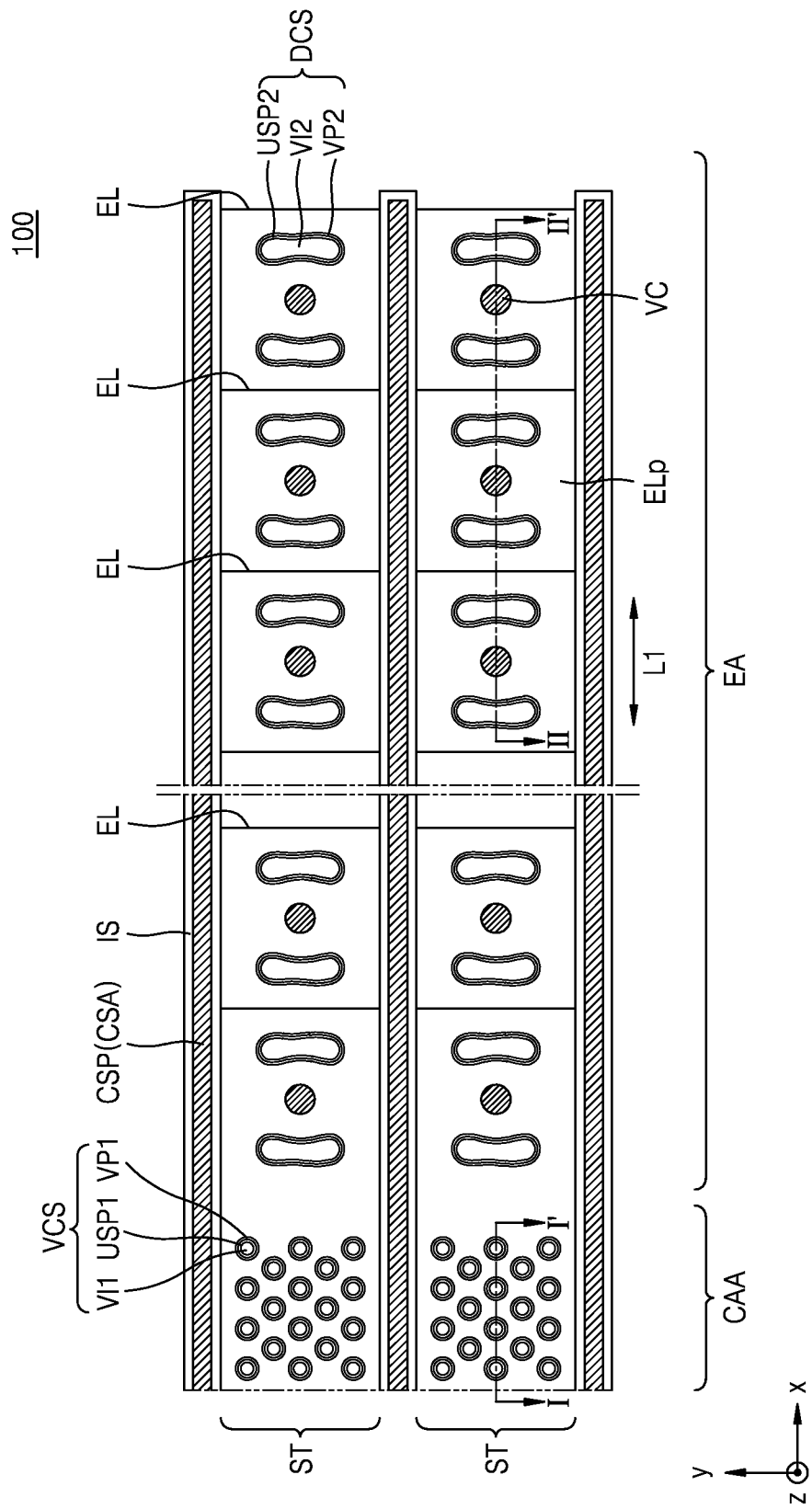
FIG. 2 illustrates a plan view of a vertical type non-volatile memory device according to embodiments of the inventive concepts.
Figure 3:
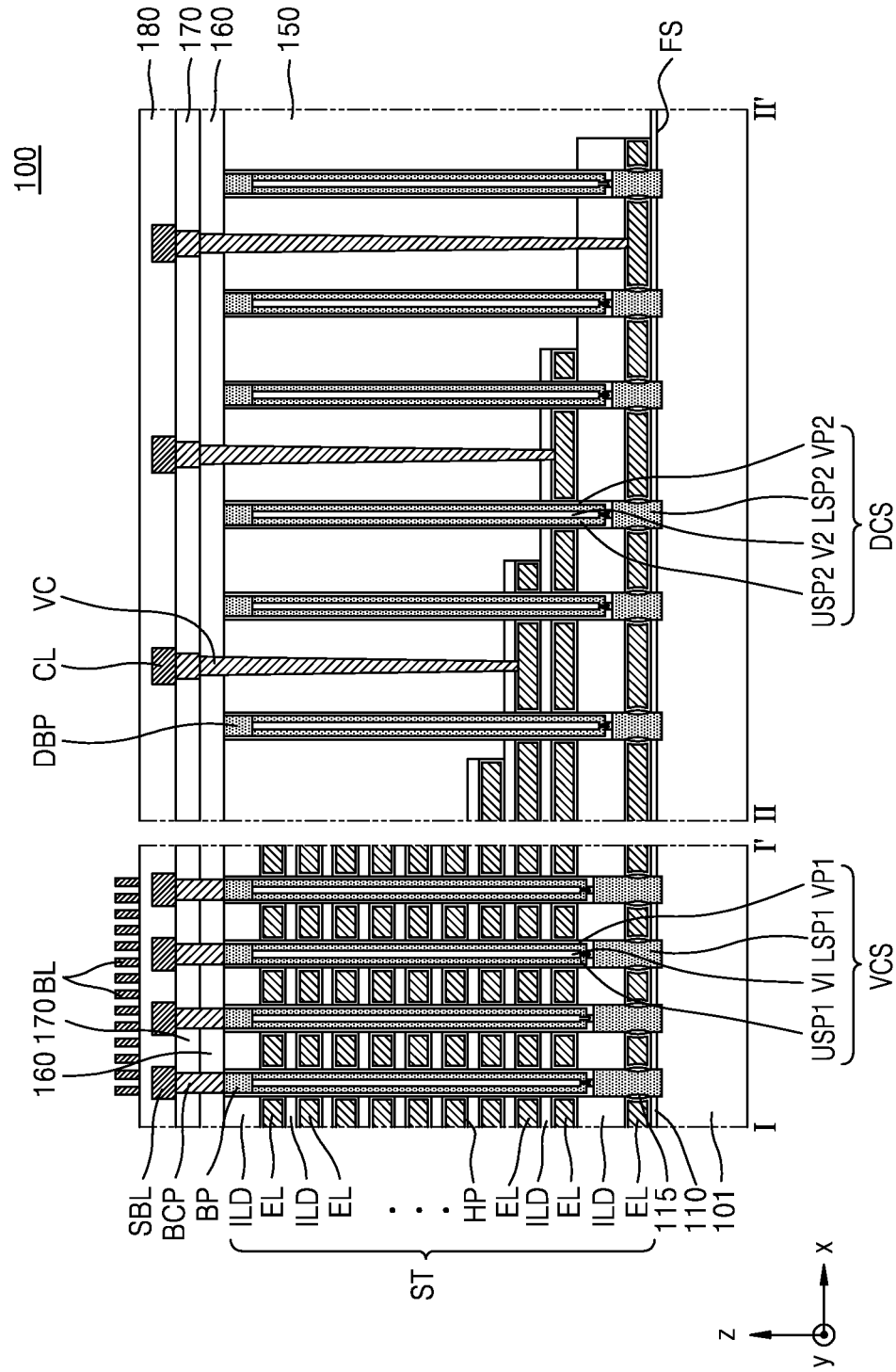
FIG. 3 illustrates cross-sectional views taken along lines I-I' and II-II' of the vertical type non-volatile memory device of FIG. 2.

FIG. 2 illustrates a plan view of a vertical type non-volatile memory device 100 according to embodiments of the inventive concepts, and FIG. 3 illustrates cross-sectional views taken along lines I-I' and II-II' of the vertical type non-volatile memory device 100 illustrated in FIG. 2. FIGS. 2 and 3 will be described in conjunction with FIG. 1.

Referring to FIGS. 2 and 3, the vertical type non-volatile memory device 100 according to embodiments may include a cell array area CAA and an extension area EA each defined on a substrate 101.

The substrate 101 may include a top surface FS, which extends in a first direction (i.e., x direction) and a second direction (i.e., y direction) that cross each other and that may be substantially perpendicular to each other. The substrate 101 may include a semiconductor material (for example, Group IV semiconductors, Groups III-V compound semiconductors, or Group II-VI oxide semiconductors). A cell area and a peripheral area disposed outside the cell area may be defined on the substrate 101.

The cell array area CAA and the extension area EA may be disposed in the cell area of the substrate 101. The cell array area CAA may be an area where the string selection transistors SST1 and SST2, the memory cell transistors MCT, and the ground selection transistor GST each configuring the cell strings described above with reference to FIG. 1 are disposed. The plurality of bit lines BL0 to BLm may be disposed at an upper portion of the cell array area CAA, and a plurality of impurity areas and the plurality of common source lines CSL may be disposed at a lower portion of the cell array area CAA.

The extension area EA may be an area where an electrode pad ELp formed by extending a gate electrode layer EL of each of the string selection transistors SST1 and SST2, the memory cell transistors MCT, and the ground selection transistor GST from the cell array area CAA in the first direction (the x direction) is disposed. In the extension area EA, the electrode pad ELp may be connected to a vertical contact VC. As seen in FIGS. 2 and 3, in the extension area EA, the respective lengths of the gate electrode layers EL in the first direction (the x direction) decrease as distance from the substrate 101 in a third direction (i.e., z direction) increases. For example, the lowermost gate electrode layer EL is longer in the x direction than the next gate electrode layer EL above it, and the uppermost gate electrode layer EL is shorter in the x direction than the next electrode layer EL under it. The z direction may be substantially perpendicular to the top surface FS of the substrate 101. The height of the electrode structure ST in the third direction (the z direction) may decrease in a direction away from the cell array area CAA. Also, side end portions of the gate electrode layer EL may be disposed apart from one another by a certain interval in the first direction (the x direction).

The electrode structure ST may extend from the cell array area CAA to the extension area EA in the first direction (the x direction) on the substrate 101. A plurality of the electrode structures ST may be provided on the substrate 101. The plurality of electrode structures ST may be disposed apart from one another in the second direction (the y direction). For example, a division area extending in the first direction (the x direction) may be disposed, and the electrode structures ST may be disposed apart from one another in the second direction (the y direction) with a division area therebetween. The division area may be referred to as a word line cut area. A buffer insulation layer 110 may be disposed between the electrode structure ST and the substrate 101.

The electrode structure ST may include a plurality of gate electrode layers EL and a plurality of interlayer insulation layers ILD, which are alternately stacked in the third direction (the z direction) vertical to the top surface FS of the substrate 101. Thicknesses of the gate electrode layers EL may be substantially the same as each other. Thicknesses of the interlayer insulation layers ILD may vary based on a characteristic of a memory device. Also, a thickness of each of the interlayer insulation layers ILD may be less than that of each of the gate electrode layers EL.

Each of the gate electrode layers EL may include an electrode pad ELp in the extension area EA. The electrode pads ELp of the gate electrode layers EL may be disposed horizontally and vertically at different positions. That is, the electrode structure ST may include the gate electrode layers EL and the interlayer insulation layers ILD, which are alternately stacked in the third direction (the z direction), and in the extension area EA, the electrode pads ELp connected to the gate electrode layers EL may form a staircase structure.

A planarization insulation layer 150 may cover the substrate 101 where the electrode structure ST is disposed. The planarization insulation layer 150 may include substantially a flat top surface. Also, the planarization insulation layer 150 may cover the staircase structure of the electrode structure ST in the extension area EA. The planarization insulation layer 150 may include one insulation layer or a stack of insulation layers.

In the cell array area CAA, a plurality of vertical channel structures VCS may be formed as structures which pass through the electrode structure ST. Also, in the extension area EA, a plurality of dummy channel structures DCS may be formed as structures which pass through the planarization insulation layer 150 and the electrode structure ST. From a one-dimensional viewpoint, the vertical channel structures VCS may be arranged in a zigzag form or pattern in the first direction (the x direction).

The dummy channel structures DCS may pass through the staircase structure of the electrode structure ST, and as a distance from the cell array area CAA in the first direction (the x direction) increases, the number of gate electrode layers EL through which the dummy channel structures DCS pass is reduced. From a one-dimensional viewpoint, the dummy channel structures DCS may be arranged at both sides of the vertical contact VC along the first direction (the x direction) in each electrode pad ELp. For example, each electrode pad ELp may include a pair of dummy channel structures DCS with a vertical contact VC therebetween. Also, from a one-dimensional viewpoint, the dummy channel structures DCS may each have a structure which extends in the second direction (the y direction). In other words, from a one-dimensional viewpoint, the dummy channel structures DCS may each have a length which is longer in the second direction (the y direction) than a length in the first direction (the x direction). Furthermore, from a one-dimensional viewpoint, the dummy channel structures DCS may each have a shape where both ends along the second direction (the y direction) are bent toward the vertical contact VC. A shape of each of the dummy channel structures DCS may correspond to a shape where vertexes thereof in a [-shape (a square bracket shape) are curved.

Figure 4A:
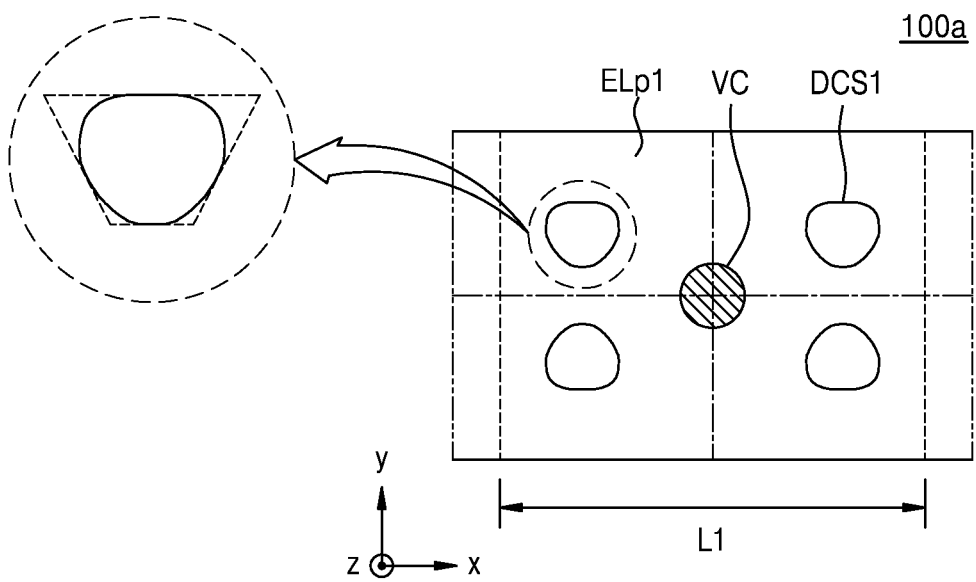
FIGS. 4A, 4B, 4C, 4D, 4E and 4F illustrate plan views of horizontal cross-sectional surfaces of a dummy channel structure and a vertical contact each disposed in an electrode pad, of a vertical type non-volatile memory device according to embodiments of the inventive concepts.
Figure 4B:
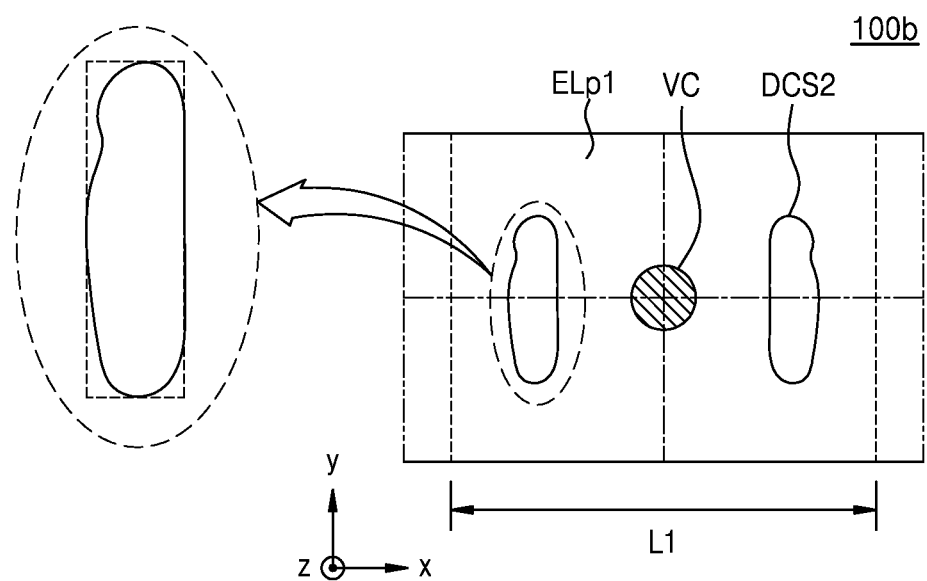
Figure 4C:
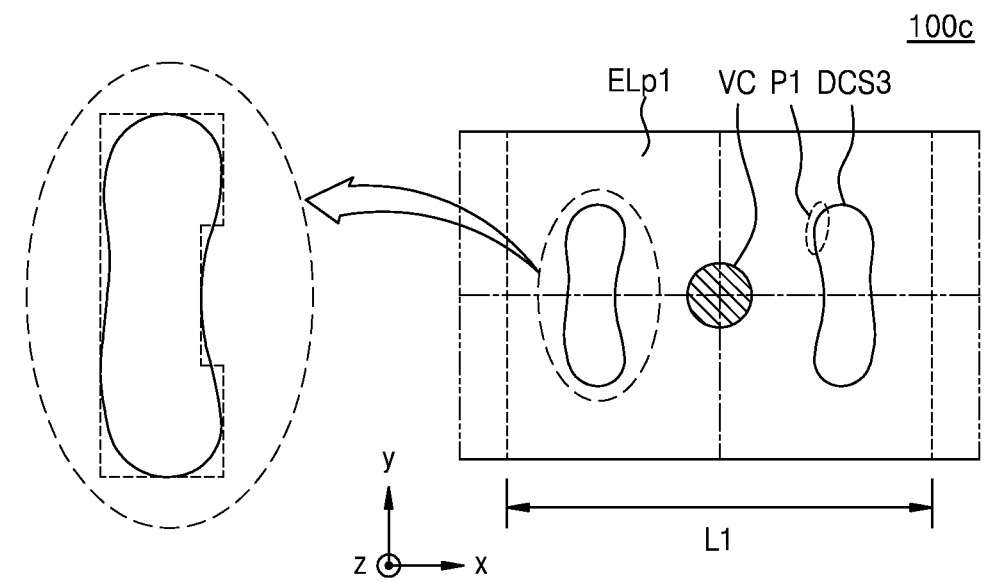

A shape of a horizontal cross-sectional surface of each dummy channel structure DCS of the vertical type non-volatile memory device 100 according to the embodiment shown in FIG. 2 may be substantially the same as a shape of a horizontal cross-sectional surface of a third dummy channel structure DCS3 of a vertical type non-volatile memory device 100c illustrated in FIG. 4C. However, a shape of the horizontal cross-sectional surface of each dummy channel structure DCS is not limited to a shape of the third dummy channel structure DCS3 shown in FIG. 4C. For example, a shape of the horizontal cross-sectional surface of each dummy channel structure DCS of the vertical type non-volatile memory device 100 according to embodiments may have any one of shapes of horizontal cross-sectional surfaces of first, second, and fourth to sixth dummy channel structures DCS1, DCS2, and DCS4 to DCS6 respectively illustrated in FIGS. 4A, 4B, and 4D to 4F. A shape of a horizontal cross-sectional surface of a dummy channel structure DCS will be described hereinafter in more detail with reference to FIGS. 4A to 9B.

Here, a one-dimensional viewpoint may denote a viewpoint of a plane that is a top surface or a bottom surface of a dummy channel structure DCS seen from above. Also, a one-dimensional viewpoint may denote a viewpoint of a plane that is a horizontal cross-sectional surface taken along a certain height of a dummy channel structure DCS in the third direction (the z direction) seen from above. In the vertical type non-volatile memory device 100 according to embodiments, a dummy channel structure DCS may be formed by forming a second vertical hole (see VH2 of FIG. 11C) and filling an inner portion thereof with a structural material. Therefore, a horizontal cross-sectional surface of the dummy channel structure DCS and a horizontal cross-sectional surface of the second vertical hole VH2 may be substantially the same as each other. Hereinafter, therefore, the horizontal cross-sectional surface of the dummy channel structure DCS and the horizontal cross-sectional surface of the second vertical hole VH2 may have the same meaning.

Bottom surfaces of the vertical channel structure VCS and the dummy channel structure DCS may be disposed at substantially the same level in the third direction (the z direction). Also, the vertical channel structure VCS and the dummy channel structure DCS may have substantially the same length in the third direction (the z direction). This is because the vertical channel structure VCS and the dummy channel structure DCS are simultaneously formed in the same process steps.

The vertical channel structure VCS may include a first lower semiconductor pattern LSP1, a first upper semiconductor pattern USP1, a first data storage pattern VP1, and a first buried insulation pattern V1. The first lower semiconductor pattern LSP1 may directly contact the substrate 101 and may include a pillar-shaped epitaxial layer grown from the substrate 101. A top surface of the first lower semiconductor pattern LSP1 may be higher than a top surface of a lowermost gate electrode layer EL, and may be lower than a top surface of a lowermost interlayer insulation layer ILD disposed on the lowermost gate electrode layer EL. A gate insulation layer 115 may be disposed at a portion of a sidewall of the first lower semiconductor pattern LSP1.

The first upper semiconductor pattern USP1 may directly contact the first lower semiconductor pattern LSP1. An inner portion of the first upper semiconductor pattern USP1 may be filled with the first buried insulation pattern V1 including an insulating material. The first lower semiconductor pattern LSP1 and the first upper semiconductor pattern USP1 may pass through the first data storage pattern VP1 and may be electrically connected to each other.

The first data storage pattern VP1 may be disposed between the electrode structure ST and the first upper semiconductor pattern USP1. The first data storage pattern VP1 may extend in the third direction (the z direction) and may surround a sidewall of the first upper semiconductor pattern USP1. The first data storage pattern VP1 may include one thin layer or a plurality of thin layers. In embodiments, the first data storage pattern VP1 may be a data storage layer of a NAND flash memory device and may include a tunnel insulation layer, a charge storage layer, and a blocking insulation layer.

The dummy channel structure DCS may include a second lower semiconductor pattern LSP2, a second upper semiconductor pattern USP2, a second data storage pattern VP2, and a second buried insulation pattern V2. An internal structure of the dummy channel structure DCS may be substantially the same as the vertical channel structure VCS. The second lower semiconductor pattern LSP2 may have a height (or upper surface) lower than a height (or upper surface) of the first lower semiconductor pattern LSP1 in the third direction (the z direction). However, according to other embodiments heights of the second lower semiconductor pattern LSP2 and the first lower semiconductor pattern LSP1 may be substantially the same.

According to embodiments, in the dummy channel structure DCS, the second upper semiconductor pattern USP2 may be removed and omitted, and a second buried insulation pattern V2 may be disposed just on the second data storage pattern VP2. In such a structure, the second buried insulation pattern V2 may pass through a bottom surface of the second data storage pattern VP2 and may directly contact the second lower semiconductor pattern LSP2.

A horizontal insulation pattern HP may extend on top surfaces and bottom surfaces of the gate electrode layer EL, between the gate electrode layer EL and the vertical channel structure VCS, and between the gate electrode layer EL and the dummy channel structure DCS. The horizontal insulation pattern HP may be a portion of a data storage layer of a NAND flash memory device and may include a charge storage layer and a blocking insulation layer. In other embodiments, the horizontal insulation pattern HP may include only a blocking insulation layer.

A bit line electrode pad BP, and a bit line contact plug BCP connected to the bit line electrode pad BP, may be disposed at an upper portion of the first upper semiconductor pattern USP1. As shown in FIG. 3, a side surface of the bit line electrode pad BP may be surrounded by the first data storage pattern VP1. According to other embodiments, the bit line electrode pad BP may be disposed on a top surface of the first upper semiconductor pattern USP1 and a top surface of the first data storage pattern VP1, and a side surface of the bit line electrode pad BP may be surrounded by a first upper interlayer insulation layer 160.

A dummy bit line electrode pad DBP may be disposed at an upper portion of the dummy channel structure DCS, and a top surface of the dummy bit line electrode pad DBP may be coplanar with a top surface of the bit line electrode pad BP. The first upper interlayer insulation layer 160 may cover a top surface of the dummy bit line electrode pad DBP. However, according to other embodiments, the dummy bit line electrode pad DBP may be omitted.

A common source area CSA may extend in the first direction (the x direction) in parallel with the electrode structures ST and may be formed by doping second conductive impurities in the substrate 101. A common source plug CSP may be connected to the common source area CSA between the electrode structures ST. In FIG. 2, the common source area CSA may be disposed under the common source plug CSP in the third direction (the z direction).

An insulation spacer IS may be disposed on each of both side surfaces of the common source plug CSP. That is, the insulation spacer IS may be disposed between the common source plug CSP and each of the electrode structures ST. According to other embodiments, the common source plug CSP may be disposed at only a portion of an upper portion of the common source area CSA, and an isolation layer may be disposed on the common source plug CSP. The insulation spacer IS or the isolation layer may configure a division area (i.e., a word line cut area) as previously described.

The first upper interlayer insulation layer 160 may be disposed on the planarization insulation layer 150 in the extension area EA. Also, the first upper interlayer insulation layer 160 may cover top surfaces of the vertical channel structures VCS and top surfaces of the dummy channel structures DCS. The second upper interlayer insulation layer 170 may be disposed on the first upper interlayer insulation layer 160 and may cover top surfaces of the insulation spacer IS and the common source plugs CSP.

In the extension area EA, the vertical contact VC may pass through the first and second upper interlayer insulation layers 160 and 170, and may be connected to an electrode pad ELp of a corresponding gate electrode layer EL. Vertical lengths of the vertical contacts VC (i.e., a length of the vertical contact VC in the third direction (the z direction)) may be reduced toward the cell array area CAA. In other words, the vertical length of a vertical contact VC closest to the cell array area CAA in the first direction (the x direction) may be shorter than the vertical length of a vertical contact further away from the cell array area CAA in the first direction (the x direction). Top surfaces of a plurality of vertical contacts VC may be substantially coplanar. From a one-dimensional viewpoint, each of the vertical contacts VC may be surrounded by the dummy channel structure DCS. In other words, each of the vertical contacts VC may be disposed between dummy channel structures DCS adjacent to each other in the first direction (the x direction).

A plurality of sub bit lines SBL may be disposed on the second upper interlayer insulation layer 170 of the cell array area CAA and may be electrically connected to corresponding vertical channel structures VCS through the bit line contact plugs BCP. In the extension area EA, a plurality of connection lines CL may be disposed on the second upper interlayer insulation layer 170 and may be connected to the vertical contacts VC. A third upper interlayer insulation layer 180 may be disposed on the second upper interlayer insulation layer 170 and may cover the sub bit lines SBL and the connection lines CL. A plurality of bit lines BL may be disposed on the third interlayer insulation layer 180 and may cross the electrode structure ST and extend in the second direction (the y direction). Although not shown, the bit lines BL may be connected to the sub bit lines SBL through corresponding contact plugs.

FIGS. 4A to 4F illustrate plan views of horizontal cross-sectional surfaces of a dummy channel structure and a vertical contact each disposed in an electrode pad, of a vertical type non-volatile memory device, according to embodiments. Descriptions, which are the same as or similar to the descriptions provided with respect to FIGS. 1 to 3, will be briefly given hereinafter or may be omitted for brevity.

Referring to FIG. 4A, in a vertical type non-volatile memory device 100a according to an embodiment, four first dummy channel structures DCS1 in a first electrode pad ELp1 may be provided at vertex positions of a tetragonal shape with a vertical contact VC therebetween. The four first dummy channel structures DCS1 thus surround the vertical contact VC so that the vertical contact VC is in between the four first dummy channel structures DCS1. The first electrode pad ELp1 may have a first length L1 in a first direction (an x direction). In FIG. 4A, a portion outside a dashed line in the first direction (the x direction) may be another first electrode pad ELp1 portion. In other words, a first electrode pad outside the dashed line may be disposed at a position which differs from that of a first electrode pad ELp1 of a center portion in the third direction (the z direction).

A shape of a horizontal cross-sectional surface of each of a plurality of first dummy channel structures DCS1 may have a trapezoid structure. In detail, the first dummy channel structure DCS1 may have a trapezoid shape where a width thereof in the first direction (the x direction) progressively narrows in a second direction (the y direction). As seen in an enlarged view in FIG. 4A, the horizontal cross-sectional surface of the first dummy channel structure DCS1 may not completely or exactly be a trapezoid (as indicated by a dashed line) but may have a trapezoid shape (as indicated by a solid line) whereby vertex portions thereof are curved.

Two first dummy channel structures DCS1 adjacent to each other in the second direction (the y direction) may be disposed so that portions thereof with widths in the first direction (the x direction) that are more narrow than other portions face each other. Two first dummy channel structures DCS1, with portions having the more narrow widths facing each other, may be disposed at each of both sides of the vertical contact VC in the first direction (the x direction).

Such a structure of the first dummy channel structure DCS1 may be based on designing of a T-shape, in designing a pattern of a shape of the horizontal cross-sectional surface of the first dummy channel structure DCS1. Designing of a shape of the horizontal cross-sectional surface of the first dummy channel structure DCS1 will be described in more detail with reference to FIG. 7A.

In the vertical type non-volatile memory device 100a according to the present embodiment, a shape of the horizontal cross-sectional surface of the first dummy channel structure DCS1 may be a shape which is selected and formed based on various selection criterions considering a characteristic of a manufacturing process. Various selection criterions associated with selecting a shape of a horizontal cross-sectional surface will be described in more detail with reference to FIGS. 8A and 8B.

Referring to FIG. 4B, in a vertical type non-volatile memory device 100b according to an embodiment, a second dummy channel structure DCS2 may be provided in a first electrode pad ELp1 at both sides thereof in a first direction (an x direction) with a vertical contact VC therebetween. A shape of a horizontal cross-sectional surface of each of a plurality of second dummy channel structures DCS2 may have a rectangular structure which is long in the second direction (the y direction). In detail, a width of the second dummy channel structure DCS2 may be longer in the second direction (the y direction) than in the first direction (the x direction). As seen in an enlarged view in FIG. 4B, the horizontal cross-sectional surface of the second dummy channel structure DCS2 may not completely or exactly be a rectangle (as indicated by a dashed line) but may have a rectangular shape (as indicated by a solid line) whereby vertex portions thereof are curved. Therefore, both ends of the second dummy channel structure DCS2 in the second direction (the y direction) may have a round shape.

Such a structure of the second dummy channel structure DCS2 may be based on designing of a rectangular shape which is long in the second direction (the y direction), in designing a pattern of a shape of the horizontal cross-sectional surface of the second dummy channel structure DCS2. Designing of a shape of the horizontal cross-sectional surface of the second dummy channel structure DCS2 will be described in more detail with reference to FIG. 7B.

Referring to FIG. 4C, in a vertical type non-volatile memory device 100c according to an embodiment, a third dummy channel structure DCS3 may be provided in a first electrode pad ELp1 at each of both sides thereof in a first direction (the x direction) with a vertical contact VC therebetween. A shape of a horizontal cross-sectional surface of each of a plurality of third dummy channel structures DCS3 may have a structure which surrounds a vertical contact VC with a long shape in a second direction (the y direction). In detail, a width of the third dummy channel structure DCS3 may be longer in the second direction (the y direction) than in the first direction (the x direction), and the third dummy channel structure DCS3 may include a first protrusion portion P1 facing the vertical contact VC at each of both end portions thereof in the second direction (the y direction). The third dummy channel structure DCS3 facing the vertical contact VC may thus in its entirety have a [-shape, or in other words a square bracket shape with an open side of the bracket facing the vertical contact VC. As seen in an enlarged view in FIG. 4C, the horizontal cross-sectional surface of the third dummy channel structure DCS3 may not completely or exactly be a [-shape (as indicated by a dashed line) but may have a [-shape (as indicated by a solid line) whereby vertex portions thereof are curved. Therefore, the third dummy channel structure DCS3 may include a protrusion portion P which protrudes from each of both end portions thereof in the second direction (the y direction) to (toward) the vertical contact VC.

Such a structure of the third dummy channel structure DCS3 may be based on designing of a [-shape, in designing a pattern of a shape of the horizontal cross-sectional surface of the third dummy channel structure DCS3. Designing of a shape of the horizontal cross-sectional surface of the third dummy channel structure DCS3 will be described in more detail with reference to FIG. 7C.

Figure 4D:
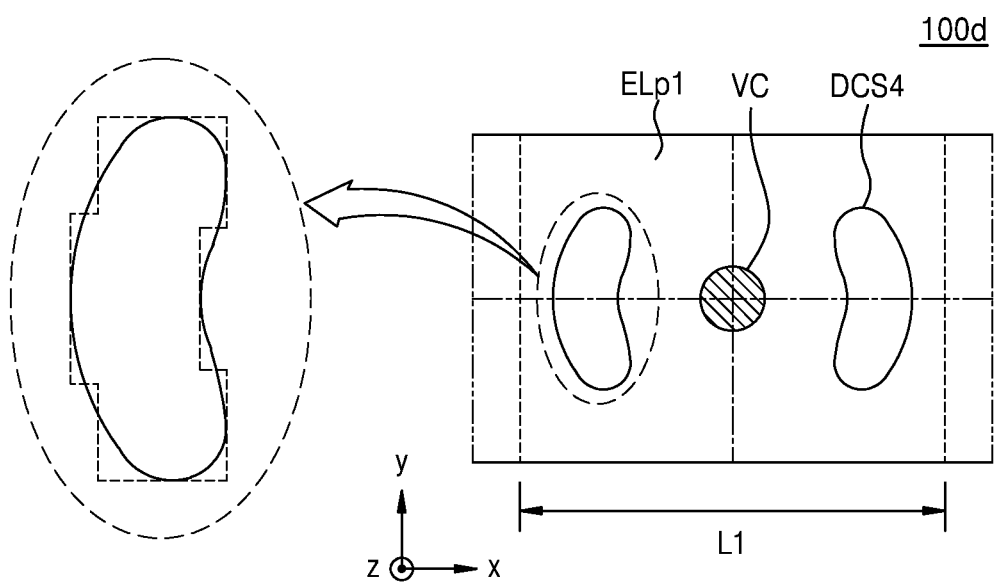

Referring to FIG. 4D, in a vertical type non-volatile memory device 100d according to an embodiment, a fourth dummy channel structure DCS4 may be provided in a first electrode pad ELp1 at both sides thereof in a first direction (an x direction) with a vertical contact VC therebetween. A shape of a horizontal cross-sectional surface of each of a plurality of fourth dummy channel structures DCS4 may have a structure which surrounds a vertical contact VC with a long shape in a second direction (a y direction). In detail, the fourth dummy channel structure DCS4 may have a (-shape (a round or curved bracket shape) surrounding the vertical contact VC. In other words, the fourth dummy channel structure DCS4 may have a rounded or curved bracket shape with the open side of the bracket facing the vertical contact VC.

Such a structure of the fourth dummy channel structure DCS4 may be based on designing of a square bracket shape (hereinafter referred to as a modified square bracket shape) whereby a center portion thereof protrudes outward away from the vertical channel VC, in designing a pattern of a shape of the horizontal cross-sectional surface of the fourth dummy channel structure DCS4. As seen in an enlarged view in FIG. 4D, a round bracket shape of the fourth dummy channel structure DCS4 may be formed by curving a vertex portion of a modified square bracket shape. Designing of a shape of the horizontal cross-sectional surface of the fourth dummy channel structure DCS4 will be described in more detail with reference to FIG. 7D.

Figure 4E:
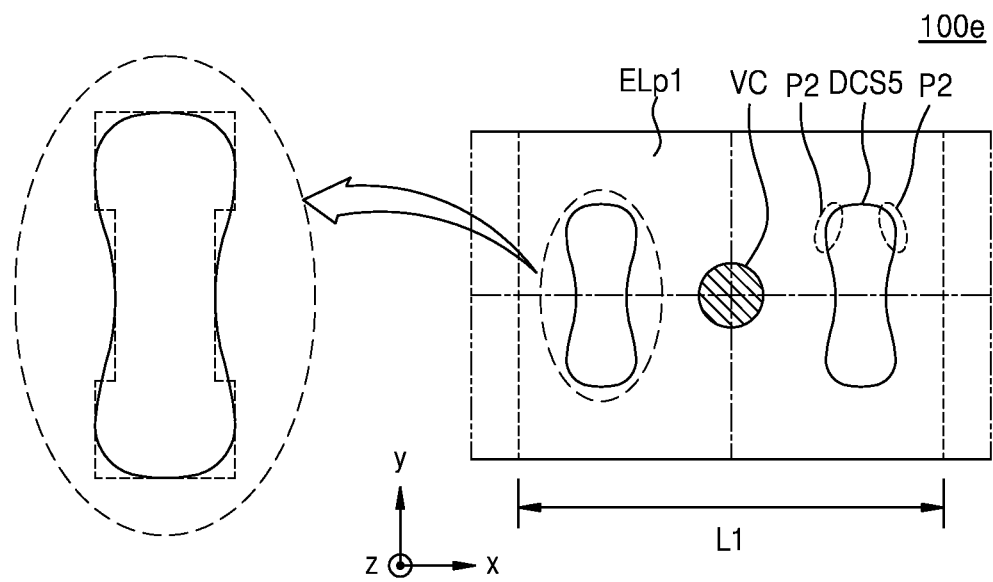

Referring to FIG. 4E, in a vertical type non-volatile memory device 100e according to an embodiment, a fifth dummy channel structure DCS5 may be provided in a first electrode pad ELp1 at both sides thereof in a first direction (the x direction) with a vertical contact VC therebetween. A shape of a horizontal cross-sectional surface of each of a plurality of fifth dummy channel structures DCS5 may have a dumbbell shape which is long in a second direction (the y direction). In detail, a width of the fifth dummy channel structure DCS5 may be longer in the second direction (the y direction) than in the first direction (the x direction), and the fifth dummy channel structure DCS5 may include a second protrusion portion P2, protruding from both sides thereof in the first direction (the x direction), at each of both end portions thereof in the second direction (the y direction) and may thus in its entirety have a dumbbell shape.

Such a structure of the fifth dummy channel structure DCS5 may be based on designing of an ⊥-shape, in designing a pattern of a shape of the horizontal cross-sectional surface of the fifth dummy channel structure DCS5. As seen in an enlarged view in FIG. 4E, a dumbbell shape of the fifth dummy channel structure DCS5 may be formed by curving vertex portions of an ⊥-shape, and the fifth dummy channel structure DCS5 may include a second protrusion portion P2, protruding from both sides thereof in the first direction (the x direction), at each of both end portions thereof in the second direction (the y direction).

Designing of a shape of the horizontal cross-sectional surface of the fifth dummy channel structure DCS5 will be described in more detail with reference to FIG. 7E.

Figure 4F:
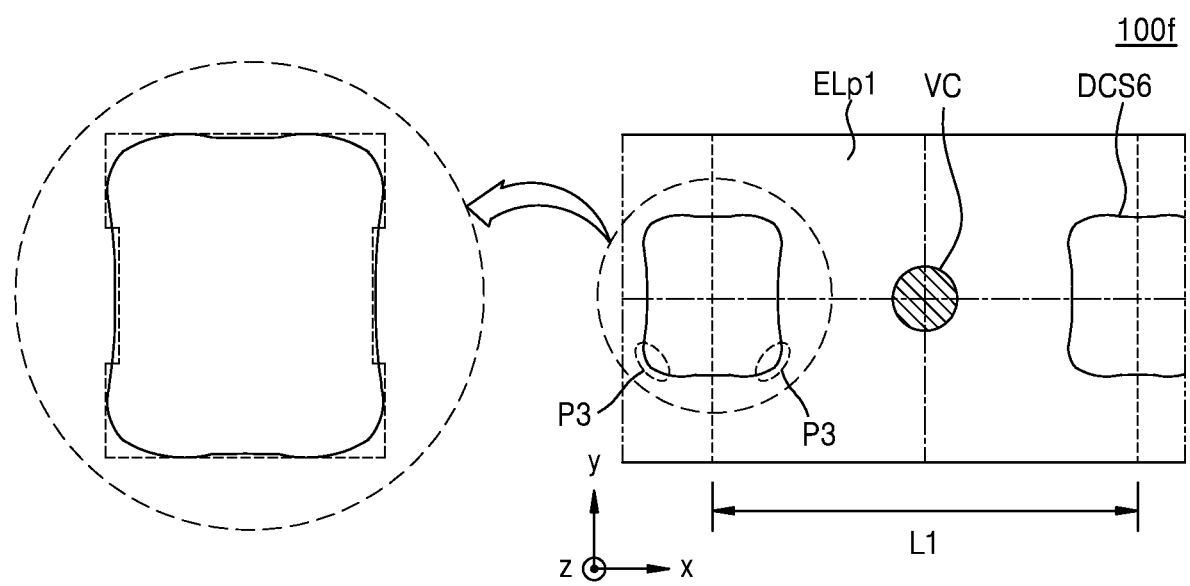

Referring to FIG. 4F, in a vertical type non-volatile memory device 100f according to an embodiment, a sixth dummy channel structure DCS6 may be provided in a first electrode pad ELp1 at both sides thereof in a first direction (an x direction) with a vertical contact VC therebetween. In that a shape of a horizontal cross-sectional surface of each of a plurality of sixth dummy channel structures DCS6 has a dumbbell shape, a shape of the horizontal cross-sectional surface of each sixth dummy channel structure DCS6 may be similar to a shape of the horizontal cross-sectional surface of the fifth dummy channel structures DCS5 illustrated in FIG. 4E. However, in contrast to the fifth dummy channel structure DCS5, the sixth dummy channel structure DCS6 is disposed at a boundary portion of the first electrode pad ELp1. Additionally, a width of the sixth dummy channel structure DCS6 in the first direction (the x direction) is greater than a width of the fifth dummy channel structure DCS5 in the first direction (the x direction).

As described previously, a first electrode pad adjacent to both sides of the first electrode pad ELp1 in the first direction (the x direction) may be a first electrode pad at a different position in a third direction (the z direction), with respect to a dashed line. Therefore, considering only a first electrode pad ELp1 portion of a center portion, a structure of the sixth dummy channel structure DCS6 may have a square bracket shape where vertex portions thereof are curved, like the third dummy channel structure DCS3 of FIG. 4C, rather than a dumbbell shape. The sixth dummy channel structure DCS6 may be disposed at a boundary portion of the first electrode pad ELp1, and thus, may be disposed apart from the vertical contact VC by a long distance in the first direction (the x direction) compared to the third dummy channel structure DCS3.

A structure of the sixth dummy channel structure DCS6 may be based on designing of an ⊥-shape, in designing of a pattern of a shape of the horizontal cross-sectional surface of the sixth dummy channel structure DCS6. Compared with the fifth dummy channel structure DCS5, a width of an ⊥-shape in the first direction (the x direction) of the sixth dummy channel structure DCS6 may be relatively greater, and moreover, a position of the sixth dummy channel structure DCS6 disposed in the first electrode pad ELp1 may differ. The sixth dummy channel structure DCS6 may include a third protrusion portion P3, protruding from both sides thereof in the first direction (the x direction), at each of both end portions thereof in the second direction (the y direction). Designing of a shape of the horizontal cross-sectional surface of the sixth dummy channel structure DCS6 will be described in more detail with reference to FIG. 7F.

FIGS. 5A to 5F illustrate plan views of horizontal cross-sectional surfaces of a dummy channel structure and a vertical contact each disposed in an electrode pad, of a vertical type non-volatile memory device, according to embodiments. Descriptions, which are the same as or similar to the descriptions provided with respect to FIGS. 1 to 4F may be briefly given hereinafter or may be omitted for brevity.

Referring to FIGS. 5A to 5E, each of a plurality of vertical type non-volatile memory devices 200a, 200b, 200c, 200d and 200e according to the present embodiments may be similar to each of the vertical type non-volatile memory devices 100a, 100b, 100c, 100d and 100e respectively illustrated in FIGS. 4A to 4E, but the following two characteristics may be differences.

First, as shown in FIGS. 5A to 5E, a second electrode pad ELp2 is provided. The second electrode pad ELp2 may have a length which is longer in a first direction (an x direction) than a first electrode pad ELp1 as shown in FIGS. 4A to 4E. For example, the second electrode pad ELp2 may have a second length L2 in the first direction (the x direction). For example, the second length L2 of the second electrode pad ELp2 may be 20% or more longer in the first direction (the x direction) than a first length L1 of the first electrode pad ELp1.

Second, an additional dummy channel structure may be provided at a boundary of the second electrode pad ELp2. For example, an additional dummy channel structure may be provided at a boundary at a first side of the vertical channel in the first direction (the x direction), and another additional dummy channel structure may be provided at a boundary at a second side of the vertical channel in the first direction. A horizontal cross-sectional surface of the additional dummy channel structure may be substantially the same as a horizontal cross-sectional surface of a dummy channel structure. For detailed example, in the vertical type non-volatile memory device 200a of FIG. 5A, a horizontal cross-sectional surface of a first additional dummy channel structure DCS1a may be substantially the same as a horizontal cross-sectional surface of a first dummy channel structure DCS1. Likewise, horizontal cross-sectional surfaces of second to fifth additional dummy channel structures DCS2a, DCS3a, DCS4a and DCS5a in respective FIGS. 5B, 5C, 5D and 5E may be substantially the same as horizontal cross-sectional surfaces of respective second to fifth dummy channel structures DCS2, DCS3, DCS4 and DCS5.

In the vertical type non-volatile memory devices 200a to 200e according to the present embodiment, second electrode pads ELp2 adjacent to each other in the first direction (the x direction) may be second electrode pads at other positions in a third direction (a z direction). Therefore, considering only one second electrode pad ELp2, only a half of the first additional dummy channel structure DCS1a may be included in a corresponding second electrode pad ELp2 at each of a left boundary portion and a right boundary portion. Also, the second to fifth additional dummy channel structures DCS2a to DCS5a may be similar.

Figure 5A:
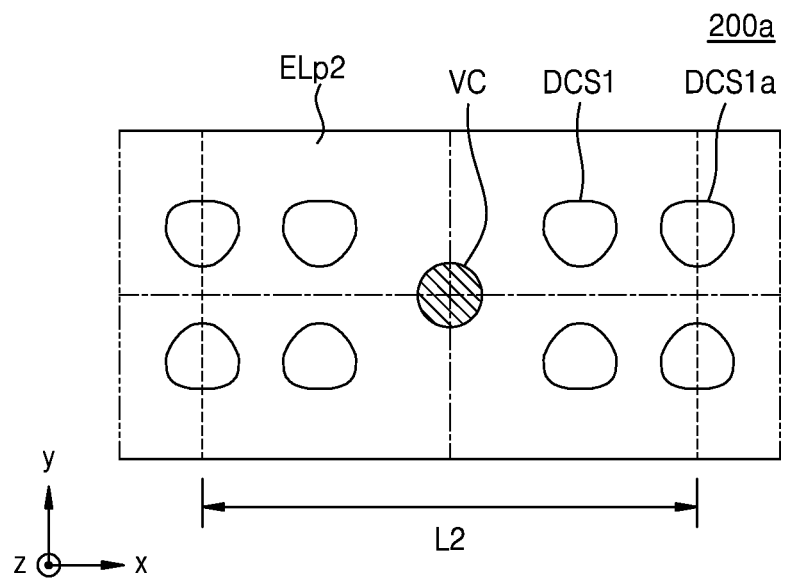
FIGS. 5A, 5B, 5C, 5D, 5E and 5F illustrate plan views of horizontal cross-sectional surfaces of a dummy channel structure and a vertical contact each disposed in an electrode pad, of a vertical type non-volatile memory device according to embodiments of the inventive concepts.
Figure 5B:
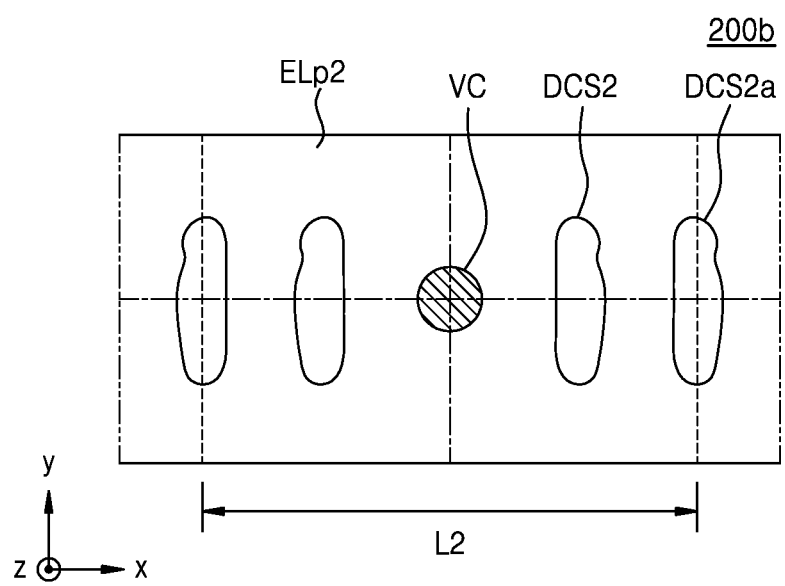
Figure 5C:
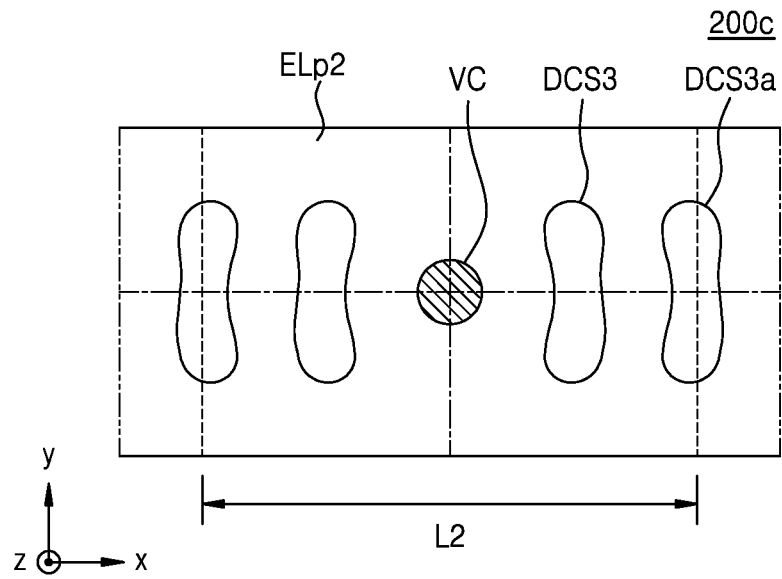
Figure 5D:
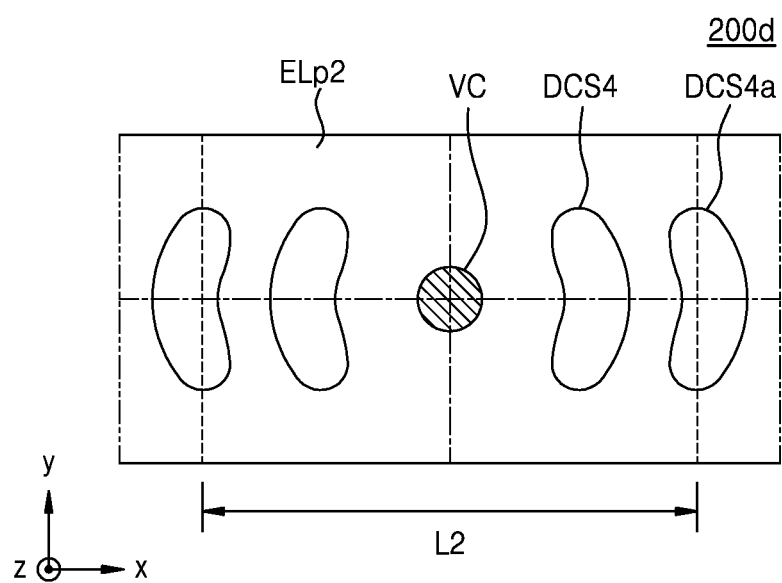
Figure 5E:
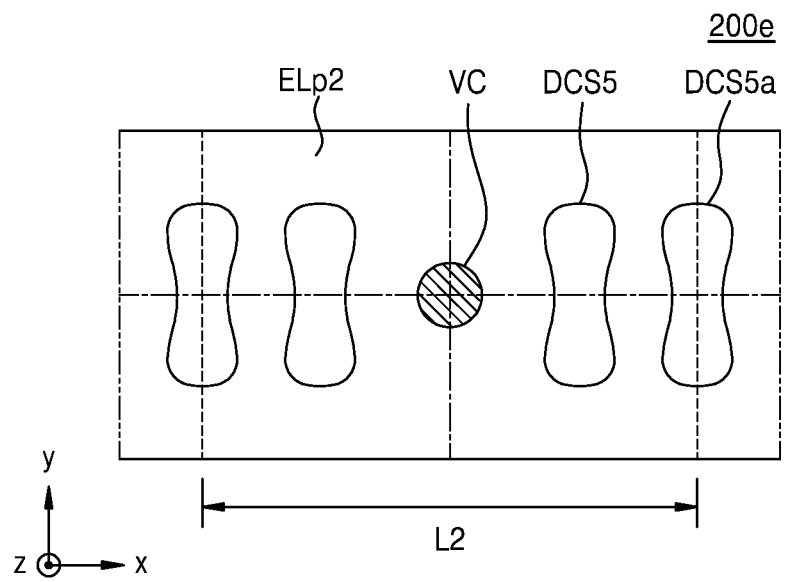
Figure 5F:
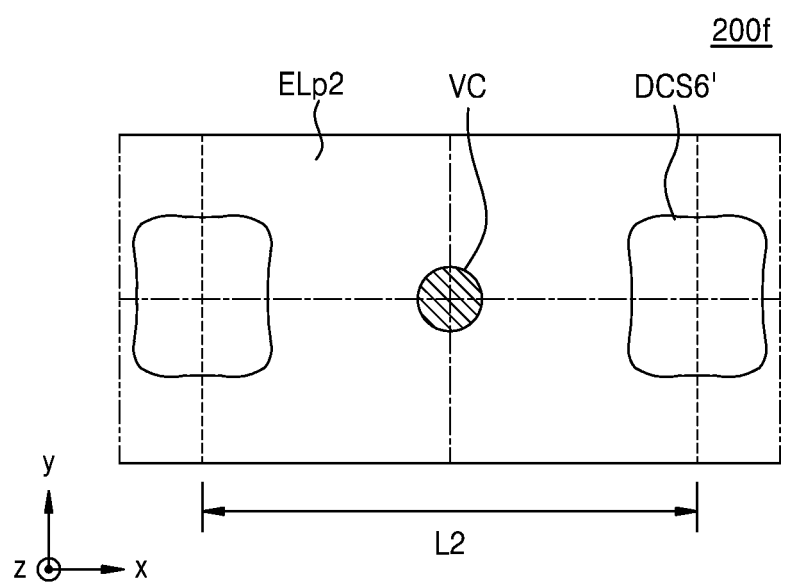
Figure 6A:
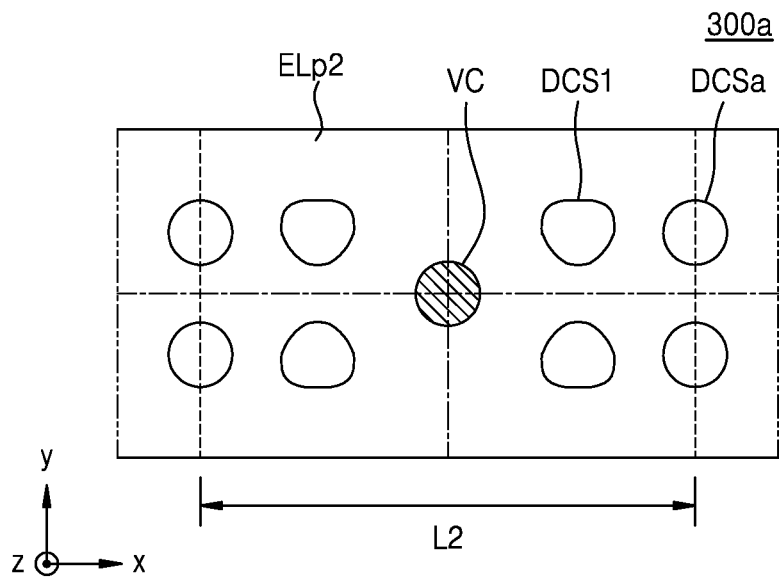
FIGS. 6A, 6B, 6C, 6D and 6E illustrate plan views of horizontal cross-sectional surfaces of a dummy channel structure and a vertical contact each disposed in an electrode pad, of a vertical type non-volatile memory device according to embodiments of the inventive concepts.
Figure 6B:
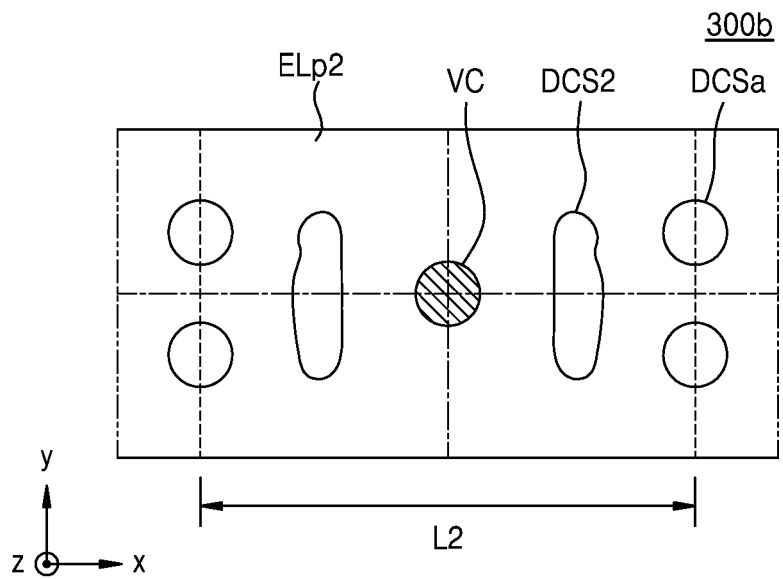
Figure 6C:
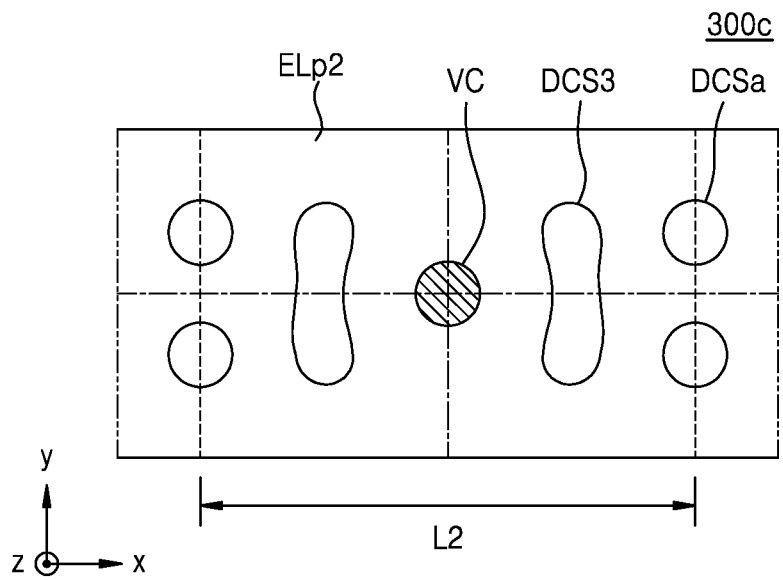
Figure 6D:
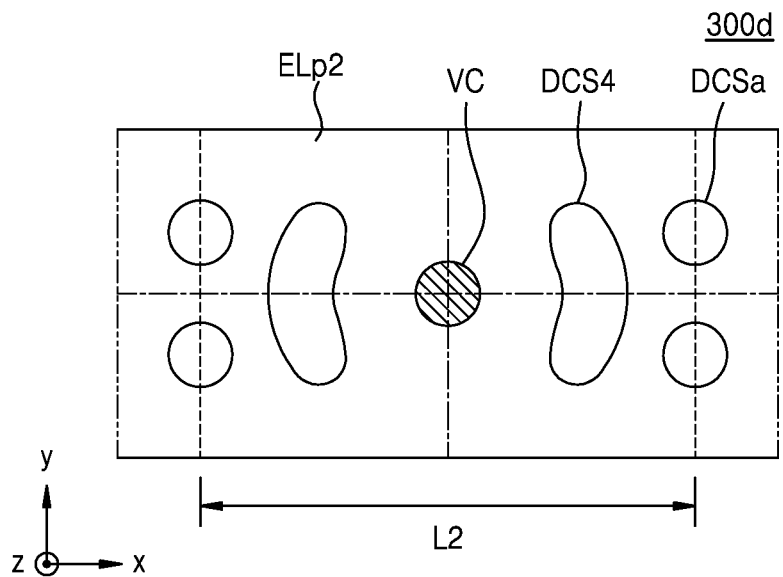
Figure 6E:
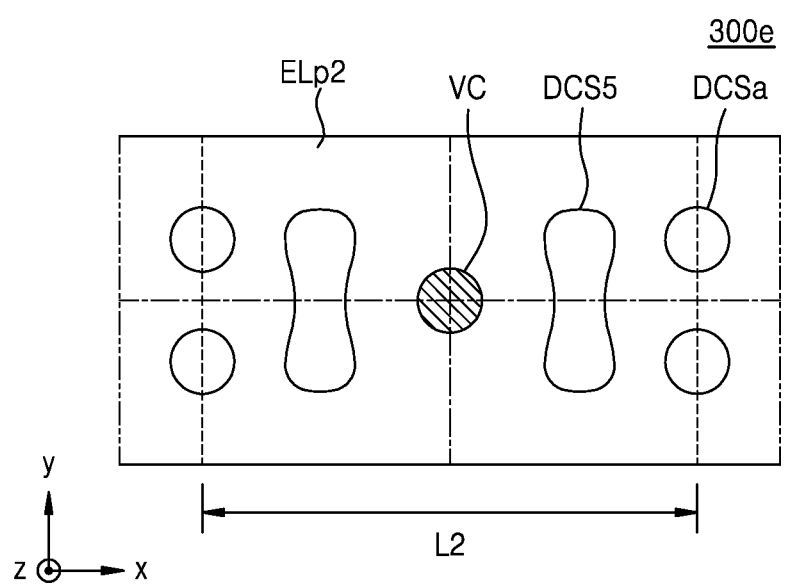

Referring to FIG. 5F, a vertical type non-volatile memory device 200f according to the present embodiment may include a second electrode pad ELp2, but unlike the vertical type non-volatile memory devices 200a to 200e, the vertical type non-volatile memory device 200f does not include an additional dummy channel structure. Also, in the vertical type non-volatile memory device 200f of FIG. 5F, a sixth dummy channel structure DCS6' may be disposed at a boundary portion of a second electrode pad ELp2 in a first direction (an x direction), like the vertical type non-volatile memory device 100f of FIG. 4F. A shape of a horizontal cross-sectional surface of the sixth dummy channel structure DCS6' may be a dumbbell shape and may be substantially the same as a shape of the horizontal cross-sectional surface of the sixth dummy channel structure DCS6 of FIG. 4F. A length of the second electrode pad ELp2 in the first direction (the x direction) may be long, and thus, a distance between a vertical contact VC and the sixth dummy channel structure DCS6' in the first direction (the x direction) may be greater than a distance between the sixth dummy channel structure DCS6 of FIG. 4F and the vertical contact VC.

FIGS. 6A to 6E illustrate plan views of horizontal cross-sectional surfaces of a dummy channel structure and a vertical contact each disposed in an electrode pad, of a vertical type non-volatile memory device according to embodiments. Descriptions, which are the same as or similar to the descriptions provided with respect to FIGS. 1 to 5F, will be briefly given hereinafter or may be omitted for brevity.

Referring to FIGS. 6A to 6E, each of a plurality of vertical type non-volatile memory devices 300a, 300b, 300c, 300d and 300e according to the present embodiments may be similar to each of the vertical type non-volatile memory devices 200a, 200b, 200c, 200d and 200e respectively illustrated in FIGS. 5A to 5E. In that the vertical type non-volatile memory devices 300a to 300e according to the present embodiment include the same additional dummy channel structure DCSa, the vertical type non-volatile memory devices 300a to 300e may differ from the vertical type non-volatile memory devices 200a to 200e respectively illustrated in FIGS. 5A to 5E. In detail, each of the vertical type non-volatile memory devices 300a to 300e according to the present embodiment may include additional dummy channel structures DCSa, whereby a shape of a horizontal cross-sectional surface thereof is a circular shape, and whereby two additional dummy channel structures DCSa are provided at each boundary portion of a second electrode pad ELp2.

In addition, considering that second electrode pads ELp2 adjacent to each other in the first direction (the x direction) are second electrode pads at other positions in a third direction (a z direction), only a half (i.e., a semicircular portion) of the additional dummy channel structure DCSa in one second electrode pad ELp2 may be included in a corresponding second electrode pad ELp2 at each of a left boundary portion and a right boundary portion.

In the vertical type non-volatile memory devices 100a to 100f, 200a to 200f, and 300a to 300e of FIGS. 4A to 6E, a case whereby an electrode pad is a first electrode pad ELp1 and a case where an electrode pad is a second electrode pad ELp2 have been described above. However, the vertical type non-volatile memory device according to other embodiments may include a structure whereby a first electrode pad ELp1 and a second electrode pad ELp2 are disposed, instead of a structure whereby only one electrode pad structure is disposed.

FIGS. 7A to 7F illustrate conceptual views of a pattern on a mask, for forming the dummy channel structure of FIGS. 4A to 4F, and correspond to one of the dummy channel structures disposed at a right side among four or two dummy channel structures disposed in a first electrode pad ELp1.

Figure 7A:
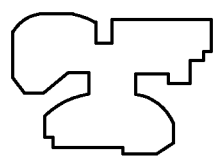
FIGS. 7A, 7B, 7C, 7D, 7E and 7F illustrate conceptual views of a pattern on a mask, for forming the dummy channel structures of respective FIGS. 4A to 4F.

Referring to FIG. 7A, a pattern on a mask for forming the first dummy channel structure DCS1 of FIG. 4A is illustrated. In detail, a layout of a pattern corresponding to a horizontal cross-sectional surface of the first dummy channel structure DCS1 may be designed for forming the first dummy channel structure DCS1 on a substrate (101 of FIG. 3). The layout of the pattern may have, for example, a T-shape.

After the layout of the pattern is designed, optical proximity correction (OPC) may be performed, and thus, a contour of a target pattern may be obtained as an OPC result. The OPC may denote a method of correcting a layout of a pattern on a mask so as to overcome an optical proximity effect (OPE) which occurs in an exposure process due to an influence between adjacent patterns according to patterns being fine. The OPC may be performed by repeatedly performing an operation of comparing a target pattern, which is to be formed on a substrate, with a contour of a target pattern as an OPC result, and changing a layout of a pattern on a mask. Here, a target pattern may be a shape of the horizontal cross-sectional surface of the first dummy channel structure DCS1. Based on such OPC, the layout of the pattern on the mask may be finally determined, and FIG. 4A illustrates a shape of the pattern on the mask based on the determined layout of the pattern on the mask.

As a result, it may be seen that a trapezoid shape of the horizontal cross-sectional surface of the first dummy channel structure DCS1 is based on a layout of a T-shaped pattern. By reflecting a characteristic where vertex or corner portions of patterns in an OPC process and an etching process are curved, as illustrated in FIG. 4A, the horizontal cross-sectional surface of the first dummy channel structure DCS1 may have a trapezoid shape where vertex portions thereof are curved.

Figure 7B:

Referring to FIG. 7B, first, a layout of a pattern corresponding to a horizontal cross-sectional surface of a second dummy channel structure DCS2 may be designed. A layout of a pattern may have, for example, a rectangular shape which is long in a second direction (a y direction). Subsequently, a layout of a pattern on a mask may be finally determined by performing an OPC process, and FIG. 4B illustrates a shape of a pattern on a mask based on the determined layout of the pattern on the mask.

As a result, it may be seen that a rectangular shape of the horizontal cross-sectional surface of the second dummy channel structure DCS2 is based on a layout of a pattern having a rectangular shape. By reflecting a characteristic where vertex or corner portions of patterns in an OPC process and an etching process are curved, as illustrated in FIG. 4B, the horizontal cross-sectional surface of the second dummy channel structure DCS2 may have a rectangular shape where vertex portions thereof are curved.

Figure 7C:
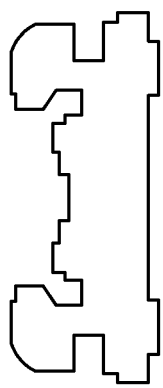

Referring to FIG. 7C, first, a layout of a pattern corresponding to a horizontal cross-sectional surface of the third dummy channel structure DCS3 of FIG. 4C may be designed. A layout of a pattern may have, for example, a square bracket shape. Subsequently, a layout of a pattern on a mask may be finally determined by performing an OPC process, and FIG. 4C illustrates a shape of a pattern on a mask based on the determined layout of the pattern on the mask.

As a result, it may be seen that a square bracket shape of the horizontal cross-sectional surface of the third dummy channel structure DCS3 is based on a layout of a pattern having a square bracket shape. By reflecting a characteristic where vertex or corner portions of patterns in an OPC process and an etching process are curved, as illustrated in FIG. 4C, the horizontal cross-sectional surface of the third dummy channel structure DCS3 may have a square bracket shape where vertex portions thereof are curved.

Figure 7D:
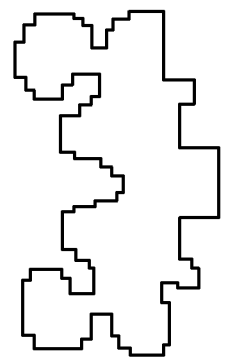

Referring to FIG. 7D, first, a layout on a pattern corresponding to a horizontal cross-sectional surface of the fourth dummy channel structure DCS4 of FIG. 4D may be designed. A layout of a pattern may have, for example, a modified square bracket shape corresponding to a square bracket shape where a center portion thereof protrudes outward. Subsequently, a layout of a pattern on a mask may be finally determined by performing an OPC process, and FIG. 4D illustrates a shape of a pattern on a mask based on the determined layout of the pattern on the mask.

As a result, it may be seen that a round bracket shape of the horizontal cross-sectional surface of the fourth dummy channel structure DCS4 is based on a layout of a pattern having a modified square bracket shape. By reflecting a characteristic where vertex or corner portions of patterns in an OPC process and an etching process are curved, as illustrated in FIG. 4D, the horizontal cross-sectional surface of the fourth dummy channel structure DCS4 may have a round bracket shape where vertex portions thereof are curved.

Figure 7E:
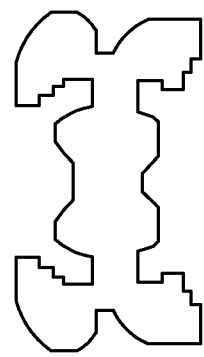

Referring to FIG. 7E, first, a layout of a pattern corresponding to a horizontal cross-sectional surface of the fifth dummy channel structure DCS5 of FIG. 4E may be designed. A layout of a pattern may have, for example, a ⊥-shape. Subsequently, a layout of a pattern on a mask may be finally determined by performing an OPC process, and FIG. 4E illustrates a shape of a pattern on a mask based on the determined layout of the pattern on the mask.

As a result, it may be seen that a dumbbell shape of the horizontal cross-sectional surface of the fifth dummy channel structure DCS5 is based on a layout of a ⊥-shaped pattern. By reflecting a characteristic where vertex or corner portions of patterns in an OPC process and an etching process are curved, as illustrated in FIG. 4E, the horizontal cross-sectional surface of the fifth dummy channel structure DCS5 may have a dumbbell shape where vertex portions thereof are curved.

Figure 7F:
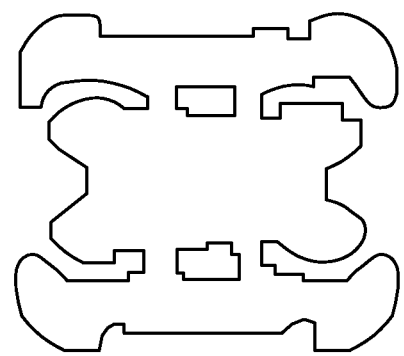

Referring to FIG. 7F, first, a layout of a pattern corresponding to a horizontal cross-sectional surface of the sixth dummy channel structure DCS6 of FIG. 4F may be designed. A layout of a pattern may have, for example, a ⊥-shape (hereinafter referred to as a modified ⊥-shape) having a large width in the first direction (the x direction). As described above, the sixth dummy channel structure DCS6 may be disposed at a boundary between electrode pads adjacent to each other in a first direction (an x direction). Therefore, a layout of a pattern may have a modified ⊥-shape which is disposed all over two electrode pads, or may have a square bracket shape in one electrode pad.

Subsequently, a layout of a pattern on a mask may be finally determined by performing an OPC process, and FIG. 4F illustrates a shape of a pattern on a mask based on the determined layout of the pattern on the mask. As described above, the sixth dummy channel structure DCS6 may be disposed at a boundary between electrode pads adjacent to each other in the first direction (the x direction), and thus, for convenience of understanding, FIG. 7F illustrates a shape of a pattern on a mask up to another electrode pad portion via a boundary portion of an electrode pad to the right.

As a result, it may be seen that a dumbbell shape (or a curved square bracket shape in terms of one electrode pad) of the horizontal cross-sectional surface of the sixth dummy channel structure DCS6 is based on a layout of a pattern having a modified ⊥-shape. By reflecting a characteristic where vertex or corner portions of patterns in an OPC process and an etching process are curved, as illustrated in FIG. 4F, the horizontal cross-sectional surface of the sixth dummy channel structure DCS6 may have a dumbbell shape (or a square bracket shape) where vertex portions thereof are curved.

Figure 8A:
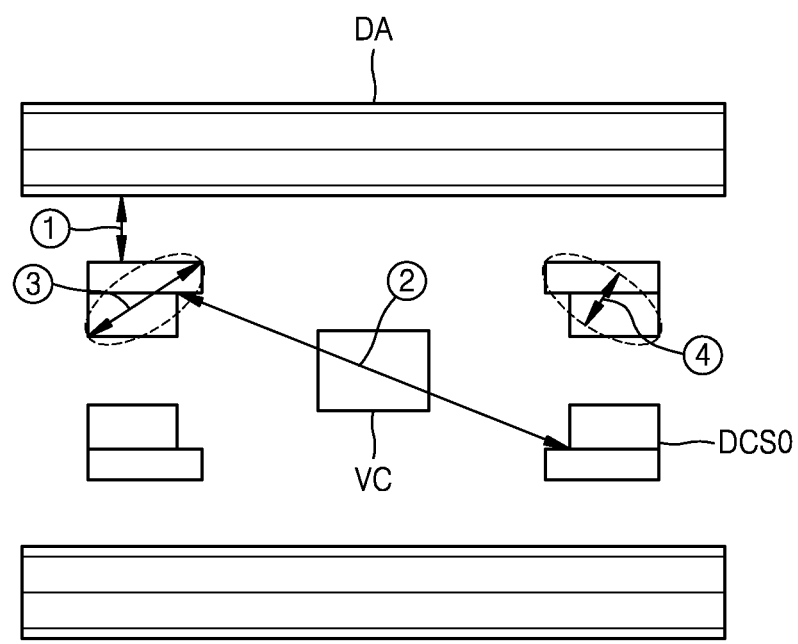
FIGS. 8A and 8B illustrate conceptual views descriptive of selection criterions, in a design of the pattern on the mask illustrated in FIGS. 7A to 7F.
Figure 8B:
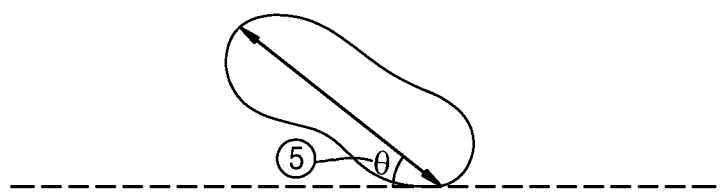

FIGS. 8A and 8B illustrate conceptual views descriptive of selection criteria, in a design of the pattern on the mask illustrated in FIGS. 7A to 7F.

Referring to FIGS. 8A and 8B, various characteristics of a manufacturing process may be considered for forming a dummy channel structure DCS. FIG. 8A illustrates four selection criteria, and FIG. 8B illustrates one selection criterion. A dummy channel structure DCS0 illustrated in FIG. 8A may correspond to a pattern of a horizontal cross-sectional surface of an arbitrary dummy channel structure for describing selection criteria.

First, a first distance ① to a division area DA in a second direction (the y direction) may be a selection criterion. The division area DA may be an area which divides a gate electrode layer in the second direction (the y direction) and may be referred to as a word line cut area. The division area DA may include a dummy cut area. When the first distance ① is short, a defect where the dummy channel structure DCS0 is adhered to the division area DA may occur. Therefore, the first distance ① between the dummy channel structure DCS0 and the division area DA in the second direction (the y direction) may be secured within a first setting range so that the dummy channel structure DCS0 does not adhere to the division area DA.

Subsequently, a maximum distance ② between dummy channel structures DCS0 in a diagonal direction crossing a vertical contact VC may be a selection criterion. In a case where the vertical contact VC is formed after the dummy channel structure DCS0 is formed, interference caused by the dummy channel structure DCS0 may be minimized Therefore, a distance between the dummy channel structure DCS0 and a vertical contact hole (see 150H of FIG. 11G) may be secured within a second setting range so that interference caused by the dummy channel structure DCS0 is minimized Here, the vertical contact hole 150H may denote a hole for forming the vertical contact VC. A distance margin between a vertical contact hole (see VH2 of FIG. 11C) and the vertical contact hole 150H may denote a contact (MC) margin, and when the dummy channel structure DCS0 is formed, an MC margin may be secured. In a case where a size of a horizontal cross-sectional surface of the vertical contact VC is constant, when the maximum distance ② increases, the MC margin may increase. Furthermore, the MC margin may denote a distance margin between the dummy channel structure DCS0 and the vertical contact hole 150H.

Also, when the MC margin is too large, namely, when a distance between the dummy channel structure DCS0 and the vertical contact hole 150H is too large, the likelihood of the occurrence of collapse of a mold structure (see 210 of FIG. 11A) may increase. This may denote that, when the dummy channel structure DCS0 is densely disposed, the collapse of the mold structure 210 is prevented by smoothly performing a supporting function of the mold structure 210 in a replacement process for a gate electrode layer EL. Therefore, the MC margin may be based on two characteristics such as a distance margin for easily forming the vertical contact VC and the supporting function of the mold structure 210.

Also, a long-axis length ③ and a short-axis length ④ of the dummy channel structure DCS0 may be a selection criterion. An increase in the long-axis length ③ may reinforce pinning of a distortion angle. An increase in the short-axis length ④ may contribute to the prevention of a not-open (N/O) defect.

To provide a more detailed description, in a case which the second vertical hole VH2 for the dummy channel structure DCS0 is formed, when a size of a horizontal cross-sectional surface of the dummy channel structure DCS0 is small, the second vertical hole VH2 may not completely be punched through to a top surface of a substrate (see 101 of FIG. 3), causing an N/O defect whereby the substrate is not exposed. Also, a distortion angle defect where a shape of a horizontal cross-sectional surface of a dummy channel structure DCS is twisted in an arbitrary direction may occur in an etching process. In FIG. 8B, a distortion angle (θ) is illustrated, and the distortion angle (θ) ⑤ may be a selection criterion.

An area of a horizontal cross-sectional surface may be sufficiently secured for preventing an N/O defect or a distortion angle defect. Also, a long-axis length of a horizontal cross-sectional surface may increase for preventing a distortion angle defect. When a long-axis length increases, pinning of a distortion angle may be reinforced, thereby minimizing a distortion angle defect. Considering a pattern density, a pattern density of the horizontal cross-sectional surface of the dummy channel structure DCS may increase, thereby minimizing an N/O defect or a distortion angle defect. Here, a pattern density may be defined as an area of the horizontal cross-sectional surface of the dummy channel structure DCS with respect to a total area of an electrode pad.

Hereinabove, five selection criterions have been described, and a selection criterion for a shape of the horizontal cross-sectional surface of the dummy channel structure DCS0 is not limited thereto. For example, whether it is possible to actually form the horizontal cross-sectional surface of the dummy channel structure DCS0 may be a selection criterion, based on OPC.

In describing advantages in terms of selection criterions for patterns on masks of FIGS. 7A to 7F, the pattern of the mask of FIG. 7A may be increased in short-axis length compared to a pattern of a dummy channel structure DCS0 of FIG. 8A. Therefore, the pattern of the mask of FIG. 7A may maintain a shape similar to the pattern of the dummy channel structure DCS0 of FIG. 8A, and thus, may not have large deformation and may reduce an N/O defect due to an increase in a short-axis length.

Compared with the pattern of the dummy channel structure DCS0 of FIG. 8A, in the patterns on the masks of FIGS. 7B to 7E, a pattern may extend in a second direction (a y direction), and thus, a length in the second direction (the y direction) may increase. Therefore, in the patterns of the masks of FIGS. 7B to 7E, an N/O defect may be reduced based on an increase in pattern density, and due to a structure connected in the second direction (the y direction), a distance margin between dummy channel structures adjacent to each other in the second direction (the y direction) may not be considered.

Compared with the pattern of the dummy channel structure DCS0 of FIG. 8A, in the pattern of the mask of FIG. 7F, due to a structure connected in the second direction (the y direction), a length in the second direction (the y direction) may increase, and moreover, a pattern may be disposed at a boundary portion of an electrode pad and thus a maximum distance in a diagonal direction may increase. Therefore, like the patterns of the mask of FIGS. 7B to 7E, the pattern of the mask of FIG. 7F may reduce an N/O defect due to an increase in pattern density, and a distance margin between dummy channel structures adjacent to each other in the second direction (the y direction) may not be considered in the pattern of the mask of FIG. 7F. Also, a maximum distance in a diagonal direction may increase, and thus, an MC margin may be sufficiently secured.

Figure 9A:
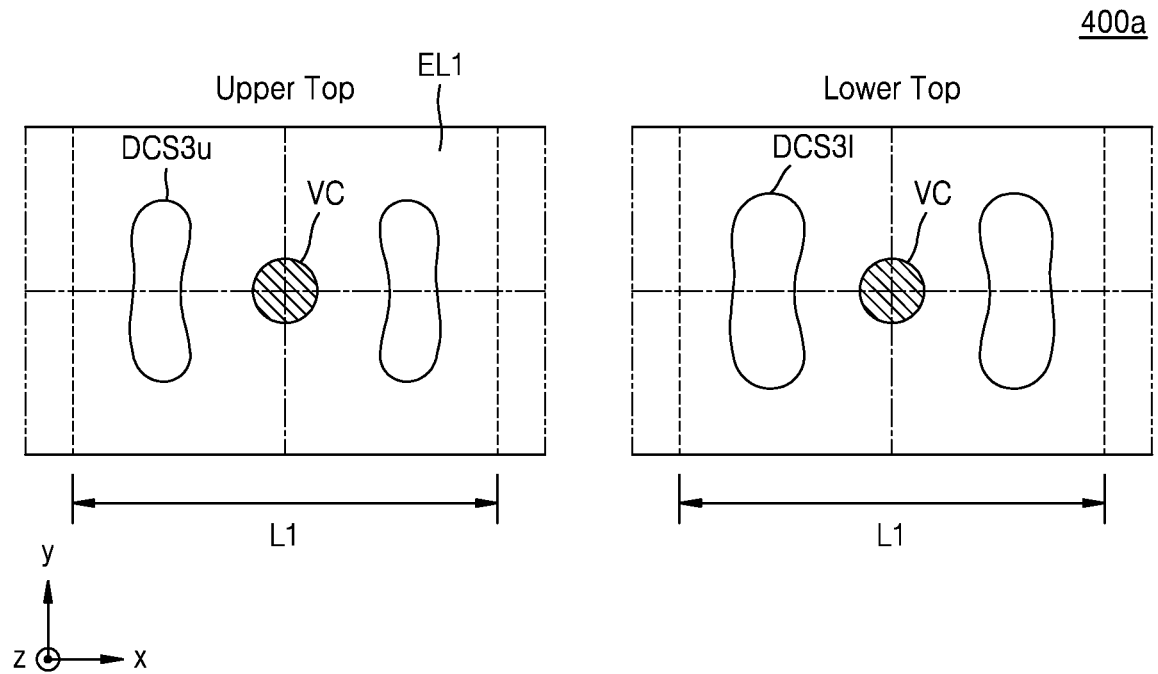
FIGS. 9A and 9B illustrate plan views of horizontal cross-sectional surfaces of a dummy channel structure and a vertical contact each disposed in an electrode pad, in a vertical type non-volatile memory device according to embodiments of the inventive concepts.
Figure 9B:
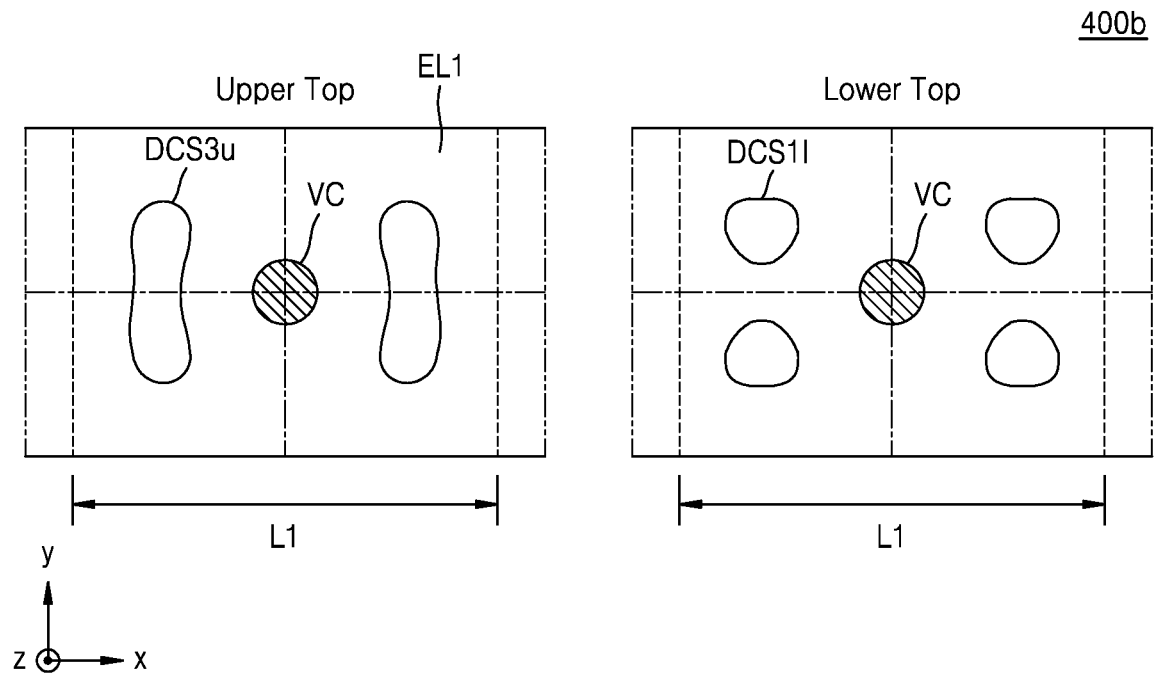

FIGS. 9A and 9B illustrate plan views of horizontal cross-sectional surfaces of a dummy channel structure and a vertical contact each disposed in an electrode pad, of a vertical type non-volatile memory device according to embodiments. The left portion of FIGS. 9A and 9B correspond to a top surface of an upper mold structure, and the right portion of FIGS. 9A and 9B correspond to a top surface of a lower mold structure.

Referring to FIG. 9A, in that a vertical type non-volatile memory device 400a according to an embodiment is formed in a multi-stack process as including an upper mold structure and a lower mold structure, the vertical type non-volatile memory device 400a according to the present embodiment may differ from the vertical type non-volatile memory devices 100a to 100f respectively illustrated in FIGS. 4A to 4F. Here, the multi-stack process may denote a process where, as a height of a vertical type non-volatile memory device in a vertical direction increases, it is difficult to form a plurality of holes passing to a substrate at a time, and due to this, a mold structure (see 210 of FIG. 11A) is formed by performing a process twice and the holes are divisionally formed in each mold structure.

The vertical type non-volatile memory device 400a according to the present embodiment may include a dummy channel structure similar to a third dummy channel structure DCS3 of a vertical type non-volatile memory device 100c of FIG. 4C. However, since the vertical type non-volatile memory device 400a according to the present embodiment is formed through the multi-stack process, a size of an upper dummy channel structure DCS3u formed in an upper mold structure may differ from a size of a lower dummy channel structure DCS3l formed in a lower mold structure. For example, as illustrated in FIG. 9A, a horizontal cross-sectional surface of the upper dummy channel structure DCS3u formed in the upper mold structure may be less than a horizontal cross-sectional surface of the lower dummy channel structure DCS3l formed in the lower mold structure. Here, a horizontal cross-sectional surface may correspond to, for example, a top surface of each of the upper dummy channel structure DCS3u and the lower dummy channel structure DCS3l. According to other embodiments, the horizontal cross-sectional surface of the upper dummy channel structure DCS3u may be greater than the horizontal cross-sectional surface of the lower dummy channel structure DCS3l, or may be substantially the same as the horizontal cross-sectional surface of the lower dummy channel structure DCS3l. Furthermore, an upper mold structure and a lower mold structure have been described as separate elements, but after a replacement process, this may correspond to all electrode structures.

The vertical type non-volatile memory device 400a according to the present embodiment is not limited to the third dummy channel structure DCS3 of the vertical type non-volatile memory device 100c of FIG. 4C and may include a dummy channel structure having a shape similar to that of any of the dummy channel structures DCS1, DCS2, and DCS4 to DCS6 of the vertical type non-volatile memory devices 100a, 100b, and 100d to 100f respectively illustrated in FIGS. 4A, 4B, and 4D to 4F. Also, a size of an upper dummy channel structure formed in an upper mold structure may differ from that of a lower dummy channel structure formed in a lower mold structure.

Referring to FIG. 9B, in that a shape of an upper dummy channel structure DCS3u formed in an upper mold structure differs from that of a lower dummy channel structure DCS1l formed in a lower mold structure, a vertical type non-volatile memory device 400b according to the present embodiment may differ from the vertical type non-volatile memory device 400a of FIG. 9A. For example, the vertical type non-volatile memory device 400b according to the present embodiment may be formed through a multi-stack process as including an upper mold structure and a lower mold structure, and an upper dummy channel structure DCS3u may have a shape similar to that of a third dummy channel structure DCS3 in FIG. 4C and a lower dummy channel structure DCS1l may have a shape similar to that of a first dummy channel structure DCS1 in FIG. 4A. A dummy channel structure of the vertical type non-volatile memory device 400b according to the present embodiment is not limited to the combination as described, but may include various combinations of first to sixth dummy channel structures DCS1 to DCS6 such as in respective FIGS. 4A to 4F.

Figure 10:
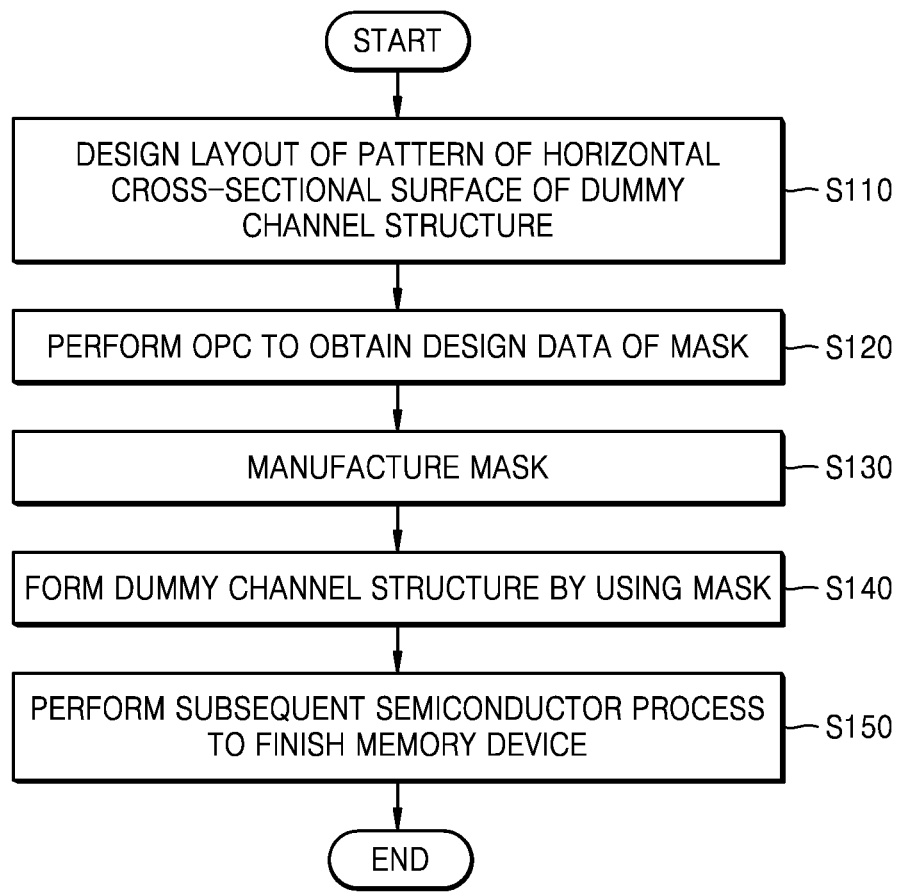
FIG. 10 illustrates a flowchart of a method of manufacturing a vertical type non-volatile memory device, according to n embodiments of the inventive concepts.

FIG. 10 illustrates a flowchart of a method of manufacturing a vertical type non-volatile memory device, according to an embodiment. Descriptions, which are the same as or similar to the descriptions provided with respect to FIGS. 1 to 9B, will be briefly given hereinafter or may be omitted for brevity.

Referring to FIG. 10, first, a method of manufacturing a vertical type non-volatile memory device according to the present embodiment may design a layout of a pattern of a horizontal cross-sectional surface of a dummy channel structure DCS in operation S110. An operation (S110) of designing the layout may include a process of designing layouts of patterns DCP1 to DCP6 of a horizontal cross-sectional surface of the dummy channel structure DCS. As described above with reference to FIGS. 7A to 9B, a layout of a pattern may be designed based on various selection criterions on the basis of a characteristic of a manufacturing process. For example, a layout of a pattern may be designed based on the above-described five selection criterions. However, the number of selection criterions is not limited to five.

Subsequently, design data of a mask may be obtained by performing OPC on the basis of a layout in operation S120. An operation (S120) of obtaining the design data of the mask may include a process of obtaining a contour of a target pattern as a result of the OPC. In other words, OPC may be performed until a contour close to a target pattern is obtained, and when a desired reference contour is obtained, data corresponding to a layout of a pattern on a mask may be obtained as design data of a mask.

Subsequently, a mask may be manufactured by performing an exposure process on the basis of the design data of the mask in operation S130. To provide a more detailed description, design data of a mask may be transferred as mask tape-out (MTO) design data to a mask manufacturing team, mask data preparation (MDP) may be performed by using MTO design data, and a mask including corresponding patterns may be manufactured by performing an exposure process on a substrate for masks.

After the mask is manufactured, a dummy channel structure DCS may be formed by using the mask in operation S140. An operation (S140) of forming the dummy channel structure DCS may include a process of forming a vertical channel structure VCS in a cell array area CAA and forming a dummy channel structure DCS in an extension area EA. The operation (S140) of forming the dummy channel structure DCS may include a process of forming first and second vertical holes VH1 and VH2 and filling structural materials in the first and second vertical holes VH1 and VH2. Before the operation (S140) of forming the dummy channel structure DCS, a mold structure 210 may be formed on a substrate 101.

Subsequently, a vertical type non-volatile memory device may be finished by performing a subsequent semiconductor process in operation S150. The subsequent semiconductor process may include various processes. A process after an operation (S130) of manufacturing the mask will be described below in more detail with reference to FIGS. 11A to 11G.

FIGS. 11A to 11G illustrate cross-sectional views of a process subsequent to a process of manufacturing a mask, in the method of manufacturing the vertical type non-volatile memory device illustrated in FIG. 10. The method of manufacturing the vertical type non-volatile memory device will be described below with reference to FIGS. 11A to 11G in conjunction with FIGS. 2 and 3, and descriptions, which are the same as or similar to the descriptions provided with respect to FIGS. 1 to 10, will be briefly given hereinafter or may be omitted for brevity.

Figure 11A:
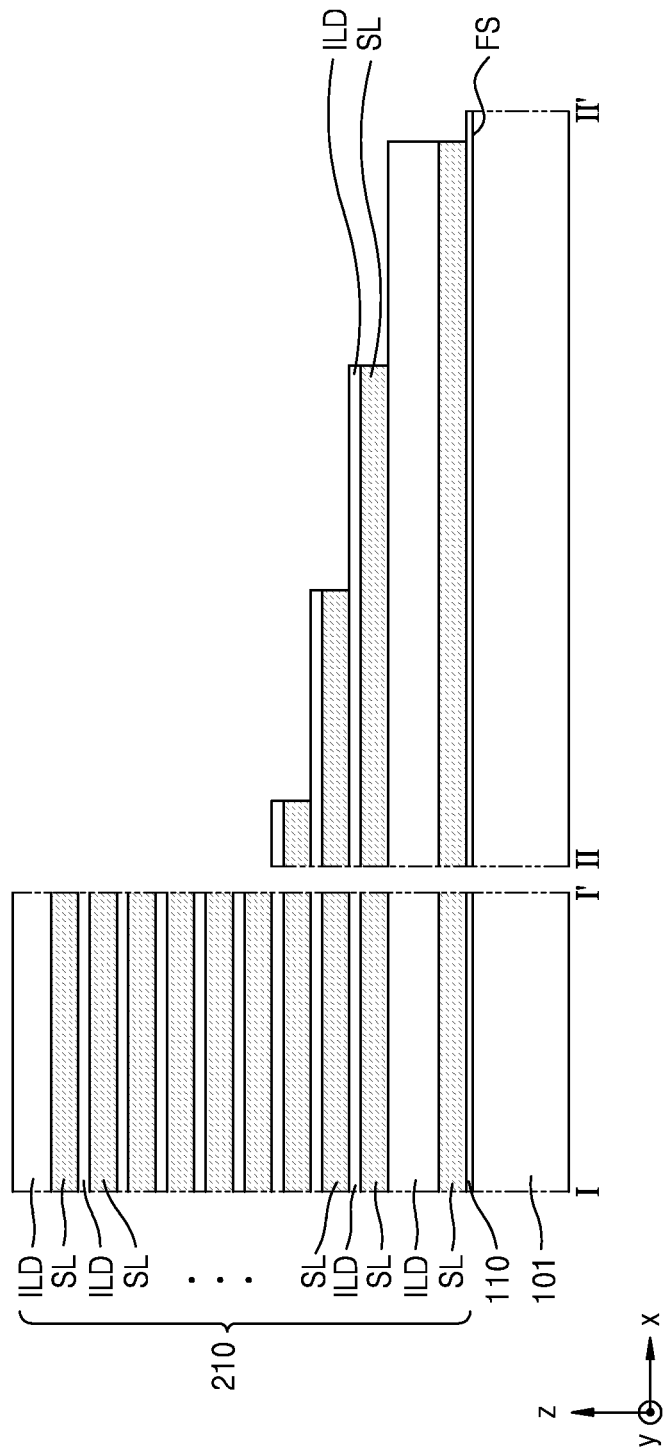
FIGS. 11A, 11B, 11C, 11D, 11E, 11F and 11G illustrate cross-sectional views of a process subsequent to a process of manufacturing a mask, in the method of manufacturing the vertical type non-volatile memory device illustrated in FIG. 10.

Referring to FIG. 11A, a mold structure 210 may be formed in a cell array area CAA and an extension area EA of a substrate 101. The mold structure 210 may include a plurality of sacrificial layers SL and a plurality of interlayer insulation layers ILD, which are vertically and alternately stacked. In the mold structure 210, the sacrificial layers SL may include a material having an etch selectivity with respect to the interlayer insulation layer ILD. A trimming process may be performed on the mold structure 210 so that a vertical cross-sectional surface thereof in the extension area EA has a staircase structure.

Figure 11B:
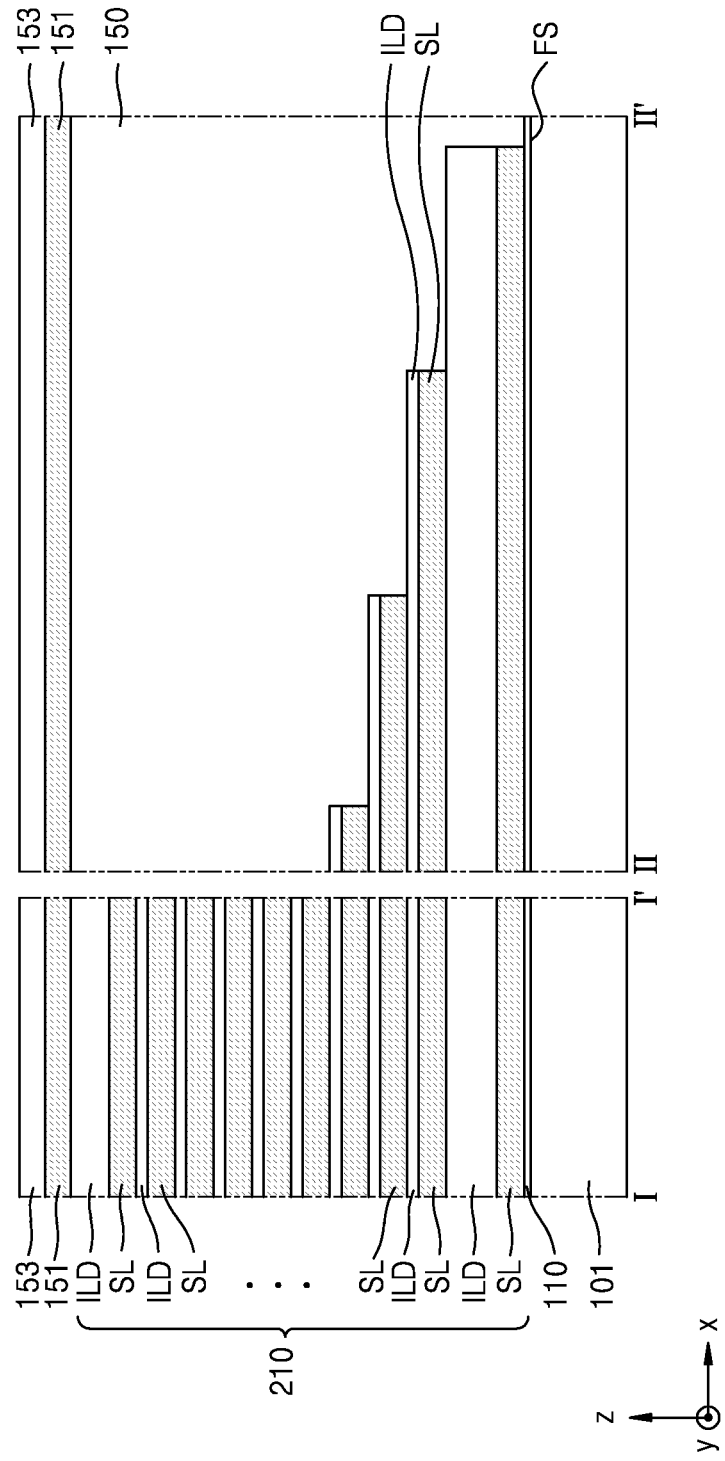

Referring to FIG. 11B, after the mold structure 210 is formed, a planarization insulation layer 150 may be formed on an entire surface of the substrate 101. The planarization insulation layer 150 may include an insulating material having an etch selectivity with respect to the sacrificial layers SL. After the planarization insulation layer 150 is formed, an etch stop layer 151 and a buffer insulation layer 153 may be sequentially formed on the planarization insulation layer 150. Here, the etch stop layer 151 may include a material having an etch selectivity with respect to the planarization insulation layer 150 and the buffer insulation layer 153.

Figure 11C:
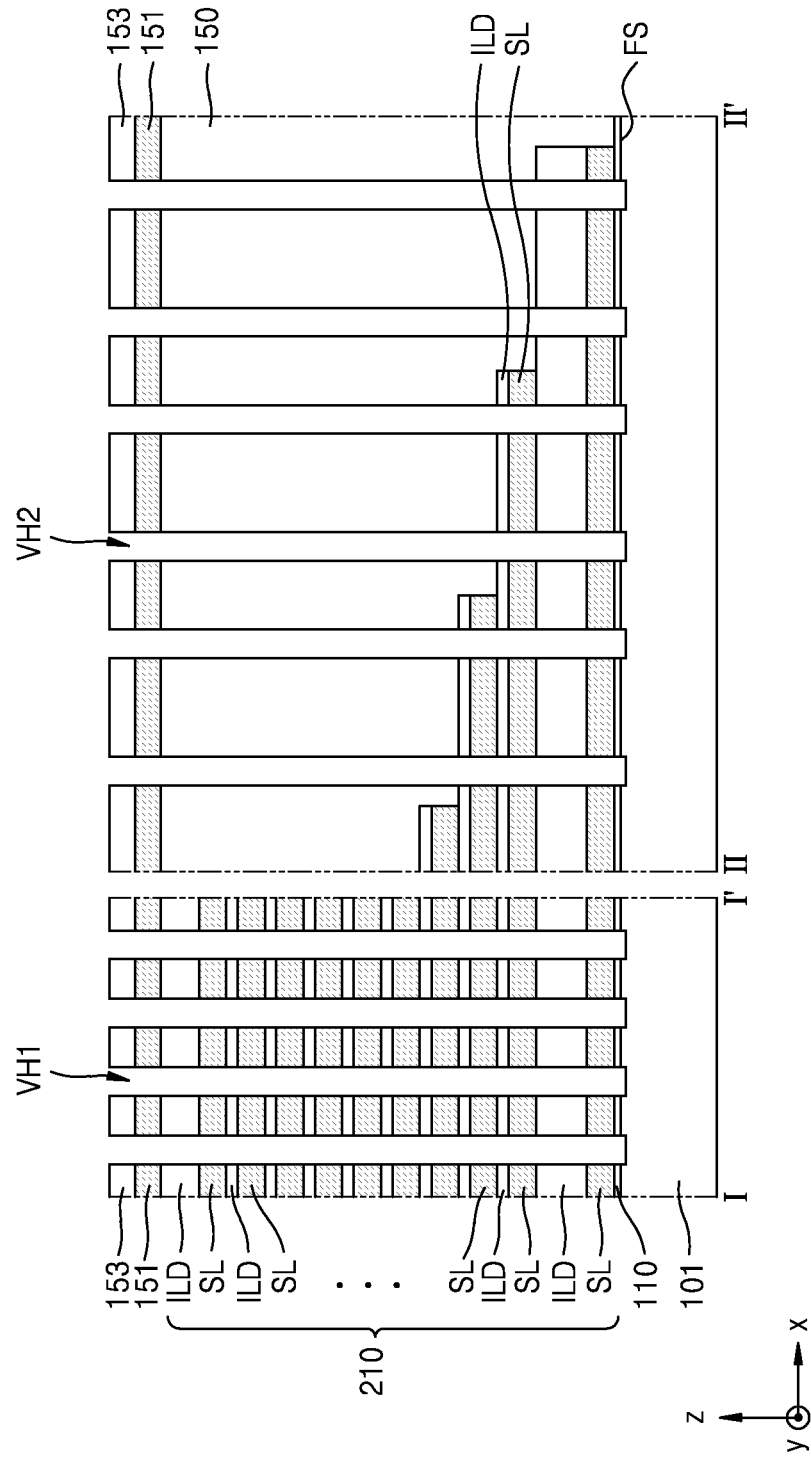

Referring to FIG. 11C, a plurality of first vertical holes VH1 passing through the buffer insulation layer 153, the etch stop layer 151, and the mold structure 210 may be formed in the cell array area CAA, and a plurality of second vertical holes VH2 passing through the buffer insulation layer 153, the etch stop layer 151, the planarization insulation layer 150, and the mold structure 210 may be formed in the extension area EA. Since the second vertical holes VH2 are formed in the extension area EA, as the second vertical holes VH2 are farther away from the cell array area CAA, the number of sacrificial layers SL passing through the second vertical holes VH2 may decrease.

Figure 11D:
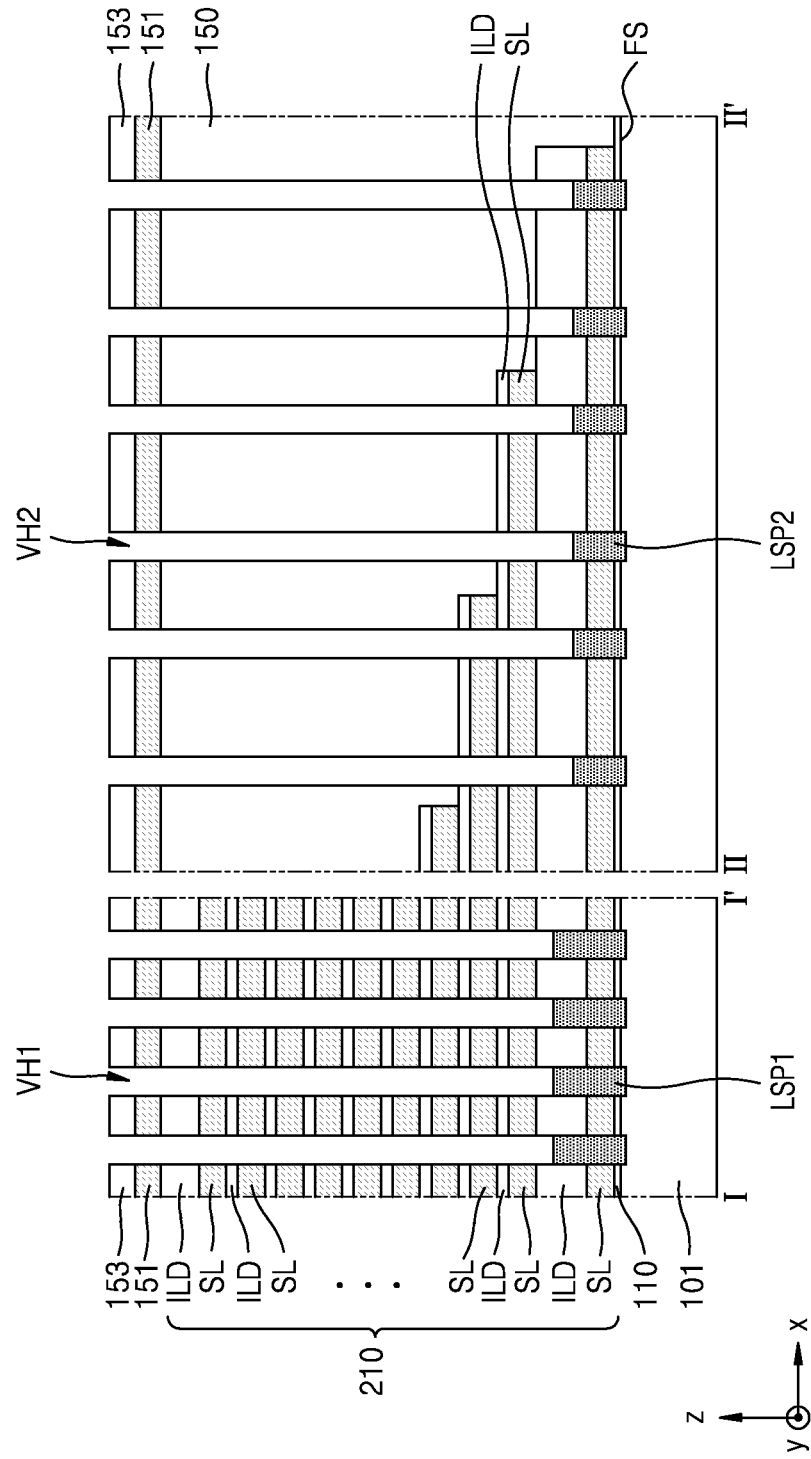

Referring to FIG. 11D, first and second lower semiconductor patterns LSP1 and LSP2 filled into lower portions of the first and second vertical holes VH1 and VH2 may be formed. The first and second lower semiconductor patterns LSP1 and LSP2 may be formed by performing a selective epitaxial growth (SEG) process by using the substrate 101, exposed at the first and second vertical holes VH1 and VH2, as a seed layer. The first and second lower semiconductor patterns LSP1 and LSP2 may be simultaneously formed, and thus, may include the same semiconductor material.

Figure 11E:
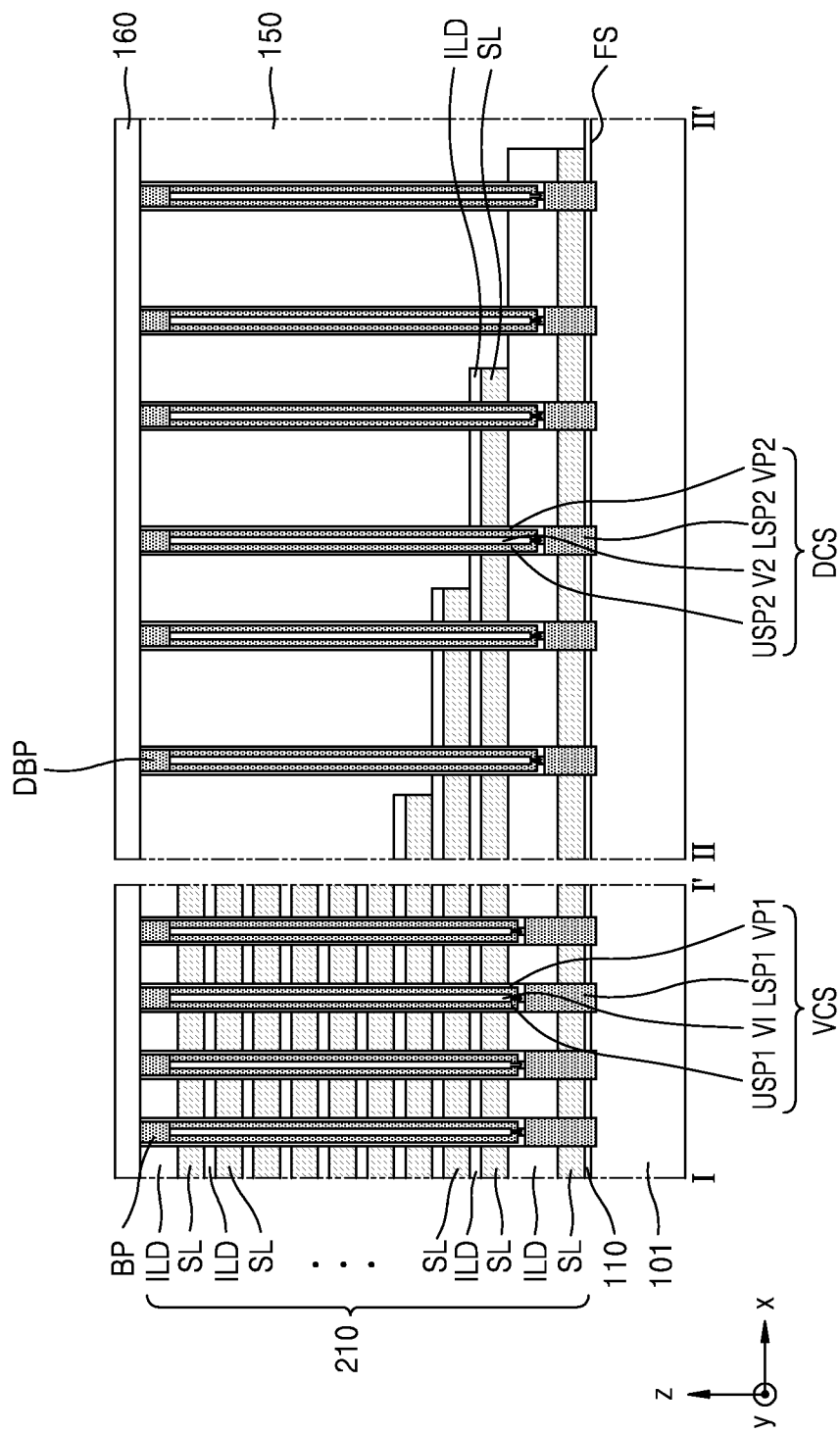

Referring to FIG. 11E, in the cell array area CAA, a first data storage pattern VP1, a first upper semiconductor pattern USP1, and a first buried insulation pattern V1 may be formed in the first vertical holes VH1 to complete the vertical channel structures VCS. Simultaneously, in the extension area EA, a second data storage pattern VP2, a second upper semiconductor pattern USP2, and a second buried insulation pattern V2 may be formed in the second vertical holes VH2 to complete the dummy channel structures DCS. The first and second upper semiconductor patterns USP1 and USP2 may be respectively connected to the first and second lower semiconductor patterns LSP1 and LSP2.

Subsequently, a plurality of bit line pads BP may be formed on first upper semiconductor patterns USP1 of a vertical channel structure VCS, and a plurality of dummy bit line pads DBP may be formed on second upper semiconductor patterns USP2 of a dummy channel structure DCS. According to other embodiments, the second upper semiconductor patterns USP2 and the dummy bit line pads DBP may not be formed in the dummy channel structure DCS.

Figure 11F:
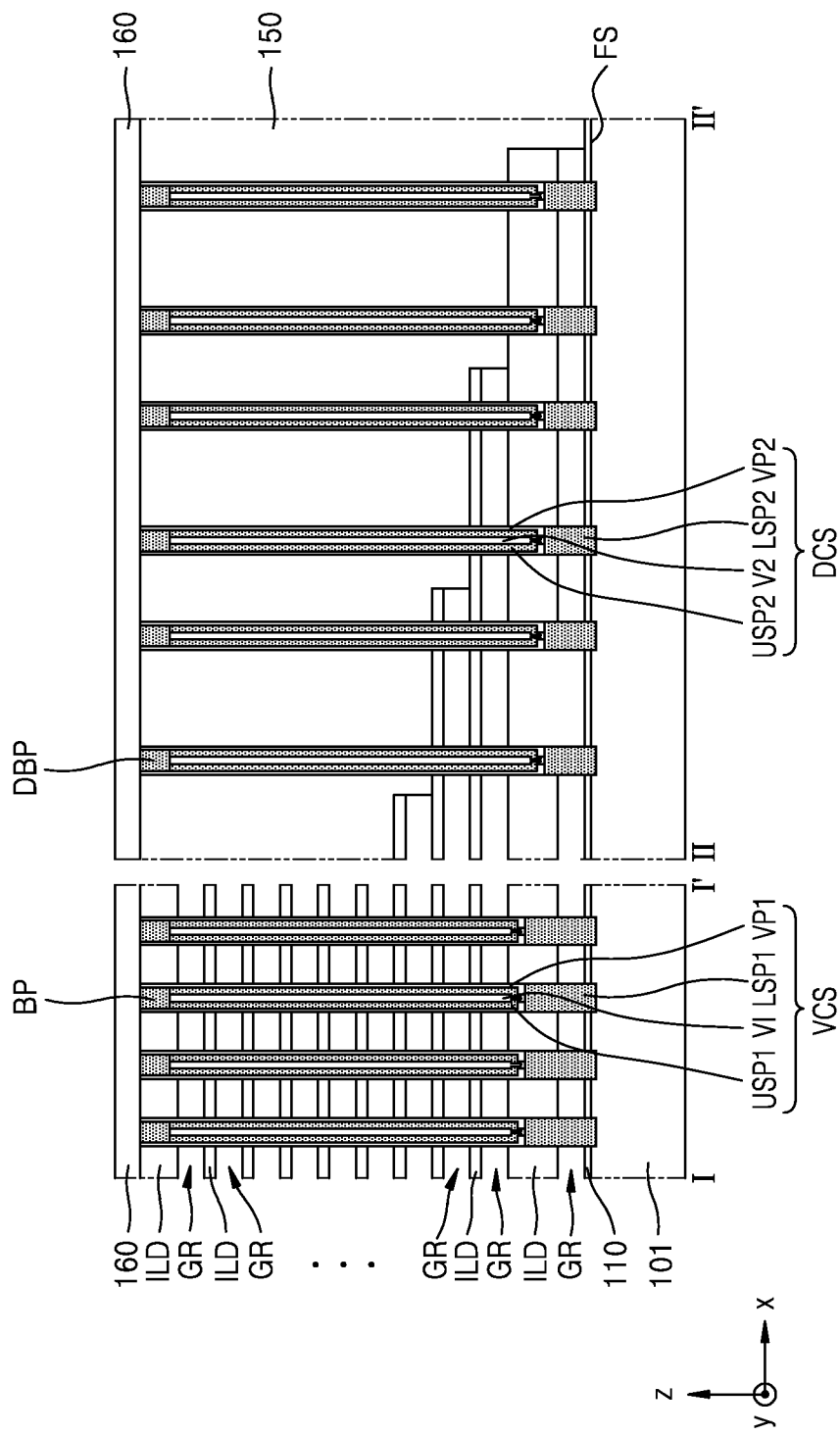
Figure 11G:
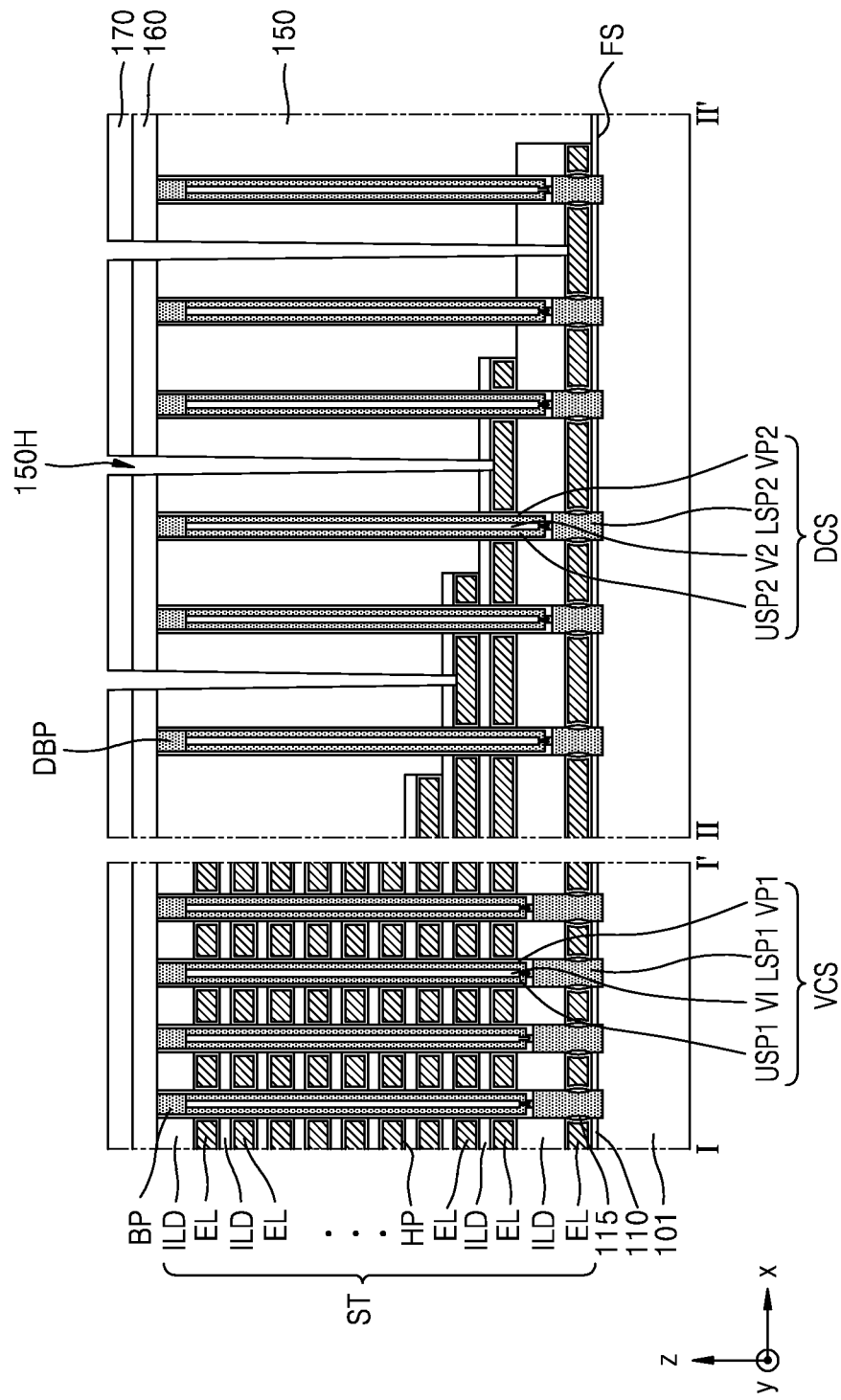

Subsequently, the buffer insulation layer 153 and the etch stop layer 151 are removed, and a first upper interlayer insulation layer 160 covering top surfaces of the vertical channel structure VCS and the dummy channel structure DCS may be formed on the planarization insulation layer 150. Referring to FIGS. 11F and 11G, after the first upper interlayer insulation layer 160 is formed, an electrode structure ST may be formed by performing a gate electrode layer replacement process of replacing the sacrificial layers SL with the gate electrode layer EL.

After the electrode structure ST is formed, a common source area CSA, an insulation spacer IS, and a common source plug CSP (e.g., see FIG. 2) may be formed, and a second upper interlayer insulation layer 170 may be formed on the first upper interlayer insulation layer 160. Subsequently, in the extension area EA, a vertical contact hole 150H passing through the first and second upper interlayer insulation layers 160 and 170 and the planarization insulation layer 150 may be formed. The vertical contact hole 150H may be formed between a plurality of dummy channel structures DCS. Subsequently, a conductive material may be buried into the vertical contact holes 150H, and thus, a vertical contact VC connected to each of the gate electrode layers EL may be formed. Subsequently, the above-described bit line contact plugs BCP, sub bit lines SBL, bit lines BL, and connection lines CL (e.g., see FIG. 3) may be formed.

While the inventive concepts have been particularly shown and described with reference to embodiments thereof, it should be understood that various changes in form and detail may be made therein without departing from the spirit and scope of the following claims.

What is claimed is:

1. A vertical type non-volatile memory device comprising:
    a substrate having a cell array area and an extension area extending in a first direction from the cell array area, the first direction extending parallel to a top surface of the substrate;
    a vertical contact disposed on the substrate in the extension area and extending in a vertical direction perpendicular to the top surface of the substrate;
    a plurality of vertical channel structures on the substrate in the cell array area and extending in the vertical direction;
    a plurality of dummy channel structures on the substrate in the extension area and extending in the vertical direction and disposed adjacent to the vertical contact;
    a plurality of gate electrode layers and a plurality of interlayer insulation layers stacked alternately on the substrate in the cell array area and the extension area along sidewalls of the plurality of vertical channel structures and the plurality of dummy channel structures; and
    an electrode pad connected to the vertical contact, wherein:
    in the electrode pad, first and second dummy channel structures, from among the plurality of dummy channel structures, are respectively disposed at a first side of the vertical contact in the first direction, and third and fourth dummy channel structures, from among the plurality of dummy channel structures, are respectively disposed at a second side of the vertical contact opposite the first side in the first direction,
    a horizontal cross-sectional surface of each of the first through fourth dummy channel structures has a shape that is longer in a second direction than in the first direction, the second direction extending parallel to the top surface of the substrate and perpendicular to the first direction,
    shapes of the first and second dummy channel structures are symmetrical with respective shapes of the third and fourth dummy channel structures relative to the vertical contact centered therebetween, and
    the plurality of dummy channel structures extend lengthwise in the second direction and have a bent structure rather than a straight line.

2. The vertical type non-volatile memory device of claim 1, wherein:
    the horizontal cross-sectional surface of each of the plurality of dummy channel structures has one of a tetragonal shape, a square bracket shape, a round bracket shape, and a dumbbell shape, wherein a vertex portion of the horizontal cross-sectional surface is curved, and
    portions of the first through fourth dummy channel structures are placed on a line passing through the vertical contact in the first direction.

3. The vertical type non-volatile memory device of claim 2, further comprising:
    a plurality of additional electrode pads and a plurality of additional vertical contacts, wherein
    in each of the plurality of additional electrode pads, a one of the additional vertical contacts is disposed between and aligned in the first direction with two pairs of the plurality of dummy channel structures.

4. The vertical type non-volatile memory device of claim 1, further comprising:
    an additional electrode pad, wherein:
    the additional electrode pad is longer than the electrode pad in the first direction, and
    an additional dummy channel structure, in addition to the plurality of dummy channel structures, is disposed in the additional electrode pad.

5. The vertical type non-volatile memory device of claim 4, wherein the additional dummy channel structure is disposed at a boundary between the electrode pad and the additional electrode pad which are adjacent to each other.

6. The vertical type non-volatile memory device of claim 4, wherein a shape of a horizontal cross-sectional surface of the additional dummy channel structure is the same as the shape of the horizontal cross-sectional surface of each of the plurality of dummy channel structures.

7. The vertical type non-volatile memory device of claim 1, further comprising:
    a division area extending in the first direction and dividing the plurality of gate electrode layers in the second direction,
    a vertical cross-sectional surface of each of the plurality of gate electrode layers and the plurality of interlayer insulation layers along the second direction has a staircase structure in the extension area,
    a distance between each of the plurality of dummy channel structures and the division area in the second direction is within a first setting range, and
    a maximum distance between two dummy channel structures from among the plurality of dummy channel structures in a diagonal direction crossing the vertical contact is within a second setting range.

8. The vertical type non-volatile memory device of claim 7, further comprising:
a plurality of additional electrode pads at end portions of the plurality of gate electrode layers in the first direction, and
a plurality of additional vertical contacts respectively connected to the plurality of additional electrode pads, wherein:
lengths of the plurality of additional vertical contacts in the vertical direction vary along the first direction based on the staircase structure, and
lengths of the plurality of dummy channel structures in the vertical direction are the same along the first direction.

9. The vertical type non-volatile memory device of claim 1, wherein:
the first dummy channel structure is partially disposed on both the electrode pad and a second electrode pad, and
the fourth dummy channel structure is partially disposed on both the electrode pad and a third electrode pad.

10. The vertical type non-volatile memory device of claim 1, wherein each of the first through fourth dummy channel structures is symmetrical about a straight line passing through a center of the vertical contact.

11. The vertical type non-volatile memory device of claim 1, wherein each of the first through fourth dummy channel structures is non-symmetrical about a straight line passing through a center of the vertical contact.

12. A vertical type non-volatile memory device comprising:
a substrate having a cell array area and an extension area extending in a first direction from the cell array area, the first direction extending parallel to a top surface of the substrate;
a vertical contact disposed on the substrate in the extension area and extending in a vertical direction perpendicular to the top surface of the substrate;
a plurality of dummy channel structures on the substrate in the extension area and extending in the vertical direction and disposed adjacent to the vertical contact;
a plurality of gate electrode layers and a plurality of interlayer insulation layers stacked alternately on the substrate in the cell array area and the extension area along sidewalls of the plurality of dummy channel structures;
an electrode pad connected to the vertical contact, wherein:
the electrode pad comprises:
first and second dummy channel structures from among the plurality of dummy channel structures disposed at a first side of the vertical contact in the first direction and third and fourth dummy channel structures from among the plurality of dummy channel structures disposed at a second side of the vertical contact opposite the first side in the first direction; and
a division area extending in the first direction and dividing the plurality of gate electrode layers in a second direction, the second direction extending parallel to the top surface of the substrate and perpendicular to the first direction,
shapes of the first and second dummy channel structures are symmetrical with respective shapes of third and fourth dummy channel structures relative to the vertical contact centered therebetween, and
the plurality of dummy channel structures extend in the second direction and have a bent structure rather than a straight line.

13. The vertical type non-volatile memory device of claim 12, wherein a horizontal cross-sectional shape of each of the first through fourth dummy channel structures has a shape that is longer in a second direction than in the first direction.

14. The vertical type non-volatile memory device of claim 12, wherein:
a horizontal cross-sectional shape of each of the first through fourth dummy channel structures has one of a tetragonal shape, a square bracket shape, a round bracket shape, and a dumbbell shape, wherein vertex portions of the horizontal cross-sectional shape are curved, and
portions of the first through fourth dummy channel structures are aligned with a line passing through the vertical contact in the first direction.

15. The vertical type non-volatile memory device of claim 12, further comprising:
an additional electrode pad, wherein:
the additional electrode pad is longer than the electrode pad in the first direction, and
an additional dummy channel structure, in addition to the plurality of dummy channel structures, is disposed in the additional electrode pad.

16. The vertical type non-volatile memory device of claim 15, wherein the additional dummy channel structure is disposed at a boundary between the electrode pad and the additional electrode pad which are adjacent to each other.

17. The vertical type non-volatile memory device of claim 12, wherein:
one of the first and second dummy channel structures is partially disposed on both the electrode pad and a second electrode pad, and
one of the third and fourth dummy channel structures is partially disposed on both the electrode pad and a third electrode pad.

18. The vertical type non-volatile memory device of claim 12, wherein each of the first through fourth dummy channel structures is symmetrical about a straight line passing through a center of the vertical contact.

19. The vertical type non-volatile memory device of claim 12, wherein each of the first through fourth dummy channel structures is non-symmetrical about a straight line passing through a center of the vertical contact.

* * * * *